US012584799B2

(12) United States Patent
Akin et al.

(10) Patent No.: US 12,584,799 B2
(45) Date of Patent: Mar. 24, 2026

(54) SWITCHING TRANSIENT BASED JUNCTION TEMPERATURE ESTIMATION OF SIC MOSFETS WITH AGING COMPENSATION

(71) Applicant: Board of Regents, The University of Texas System, Austin, TX (US)

(72) Inventors: Bilal Akin, Richardson, TX (US); Masoud Farhadi, Dallas, TX (US); Abdolrahman Sajadi, Dallas, TX (US); Bhanu Teja Vankayalapati, Richmond, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 205 days.

(21) Appl. No.: 18/497,426

(22) Filed: Oct. 30, 2023

(65) Prior Publication Data

US 2025/0102369 A1 Mar. 27, 2025

Related U.S. Application Data

(60) Provisional application No. 63/584,550, filed on Sep. 22, 2023.

(51) Int. Cl.
| | |
|---|---|
| *G01R 31/26* | (2020.01) |
| *G01K 7/01* | (2006.01) |
| *H03K 17/687* | (2006.01) |

(52) U.S. Cl.
CPC ........... *G01K 7/01* (2013.01); *G01R 31/2628* (2013.01); *H03K 17/687* (2013.01); *G01K 2217/00* (2013.01)

(58) Field of Classification Search
CPC ............ G01R 31/2628; G01R 31/2621; G01R 31/2601; G01R 31/2642; G01R 31/26;
(Continued)

(56) References Cited

U.S. PATENT DOCUMENTS

| | | | |
|---|---|---|---|
| 6,349,267 B1 * | 2/2002 | Goldthorp | ........ G01R 31/31922 702/69 |
| 11,397,209 B2 * | 7/2022 | Akin | .................. G01R 31/2644 |

(Continued)

OTHER PUBLICATIONS

B. J. Baliga, Fundamentals of Power Semiconductor Devices. Springer Science and Business Media, 2010.
(Continued)

*Primary Examiner* — Vinh P Nguyen
(74) *Attorney, Agent, or Firm* — Stanek Lemon Crouse & Meeks, PA

(57) ABSTRACT

An apparatus and method are provided for estimating junction temperature in a metal-oxide-semiconductor field-effect transistor (MOSFET), such as a silicon carbide (SiC) MOSFET, by capturing switching transients in a source path. A measurement circuit detects a voltage across a stray inductive element during a turn-on or turn-off phase and converts the transient into a pulse having a width proportional to a rise time or fall time. A processor determines junction temperature based on the pulse width and stored correlations between transient durations and temperature. An auxiliary switch circuit may temporarily insert a gate resistance to facilitate transient capture. Aging effects are compensated by analyzing temperature-dependent variations in rise and fall times to adjust temperature estimation over the device lifetime. The system can be integrated into gate driver circuitry for real-time monitoring without substantial disruption to normal converter operation.

16 Claims, 12 Drawing Sheets

(58) Field of Classification Search
CPC .............. G01R 31/327; G01R 31/2617; G01R 31/2637; G01R 31/282; G01R 31/2832; G01R 31/28; G01K 7/01; G01K 2217/00; G01K 7/427; G01K 7/00; G01K 7/425

See application file for complete search history.

(56)                References Cited

U.S. PATENT DOCUMENTS

| | | | |
|---|---|---|---|
| 11,474,145 B2 * | 10/2022 | Ugur .................. | G01R 31/2644 |
| 11,525,740 B2 * | 12/2022 | Akin .......................... | G01K 7/01 |
| 11,674,856 B2 * | 6/2023 | Steiner ..................... | G01K 7/01 |
| | | | 374/178 |
| 11,876,509 B1 * | 1/2024 | Zeng .................... | H03K 17/166 |

OTHER PUBLICATIONS

K. Suganuma, Wide Bandgap Power Semiconductor Packaging: Materials, Components, and Reliability, ser. Woodhead Publishing Series in Electronic and Optical Materials. Woodhead Publishing, 2018.

K. Boomer, J.-M. Lauenstein, and A. Hammoud, Body of Knowledge for Silicon Carbide Power Electronics, 2016. [Online]. Available: https://ntrs.nasa.gov/archive/nasa/casi.ntrs.nasa.gov/20170003922. pdf.

C. Li, H. Luo, C. Li, W. Li, H. Yang, and X. He, Online Junction Temperature Extraction of SiC Power MOSFETs With Temperature Sensitive Optic Parameter (TSOP) Approach, IEEE Transactions on Power Electronics, vol. 34, No. 10, pp. 10143-10152, 2019.

G. Breglio, A. Irace, P. Spirito, R. Letor, and S. Russo, Fast Transient Infrared Thermal Analysis of Smart Power MOSFETS in Permanent Short Circuit Operation, in 2006 IEEE International Symposium on Power Semiconductor Devices and ICs , pp. 1-4, 2006.

A. S. Bahman, K. Ma, P. Ghimire, F. Iannuzzo, and F. Blaabjerg, A 3-D-Lumped Thermal Network Model for Long-Term Load Profiles Analysis in High-Power IGBT Modules, IEEE Journal of Emerging and Selected Topics in Power Electronics, vol. 4, No. 3, pp. 1050-1063, 2016.

K. Ma, N. He, M. Liserre, and F. Blaabjerg, Frequency-Domain Thermal Modeling and Characterization of Power Semiconductor Devices, IEEE Transactions on Power Electronics, vol. 31, No. 10, pp. 7183-7193, 2016.

Y. Avenas, L. Dupont, and Z. Khatir, Temperature Measurement of Power Semiconductor Devices by Thermo- Sensitive Electrical Parameters—A Review, IEEE Transactions on Power Electronics, vol. 27, No. 6, pp. 3081-3092, 2012.

H. Luo, W. Li, F. Iannuzzo, X. He, and F. Blaabjerg, Enabling Junction Temperature Estimation via Collector-Side Thermo-Sensitive Electrical Parameters Through Emitter Stray Inductance in High-Power IGBT Modules, IEEE Transactions on Industrial Electronics, vol. 65, No. 6, pp. 4724-4738, 2018.

A. Griffo, J. Wang, K. Colombage, and T. Kamel, Real-Time Measurement of Temperature Sensitive Electrical Parameters in SiC Power MOSFETs, IEEE Transactions on Industrial Electronics, vol. 65, No. 3, pp. 2663-2671, 2018.

H. Niu and R. D. Lorenz, Sensing Power MOSFET Junction Temperature Using Circuit Output Current Ringing Decay, in 2013 IEEE Energy Conversion Congress and Exposition, pp. 4270-4277, 2013.

L. Cheng, A. K. Agarwal, S. Dhar, S.-H. Ryu, and J. W. Palmour, Static Performance of 20 A, 1200 V 4H—SiC Power MOSFETs at Temperatures of -187 C to 300 C, Journal of electronic materials, vol. 41, pp. 910-914, 2012.

H. Niu and R. D. Lorenz, Sensing Power MOSFET Junction Temperature Using Gate Drive Turn-On Current Transient Properties, in 2014 IEEE Energy Conversion Congress and Exposition (ECCE), pp. 2909-2916, 2014.

N. Baker, S. Munk-Nielsen, F. Iannuzzo, and M. Liserre, Online Junction Temperature Measurement Using Peak Gate Current, in 2015 IEEE Applied Power Electronics Conference and Exposition (APEC), pp. 1270-1275, 2015.

R. Wang, J. Sabate, K. Mainali, T. Sadilek, P. Losee, and Y. Singh, SiC Device Junction Temperature Online Monitoring, in 2018 IEEE Energy Conversion Congress and Exposition (ECCE), pp. 387-392, 2018.

F. Yang, S. Pu, C. Xu, and B. Akin, Turn-on Delay Based Real-Time Junction Temperature Measurement for SiC MOSFETs With Aging Compensation, IEEE Transactions on Power Electronics, vol. 36, No. 2, pp. 1280-1294, 2021.

Z. Zhang, J. Dyer, X. Wu, F. Wang, D. Costinett, L. M. Tolbert, and B. J. Blalock, Online Junction Temperature Monitoring Using Intelligent Gate Drive for SiC Power Devices, IEEE Transactions on Power Electronics, vol. 34, No. 8, pp. 7922-7932, 2019.

B. Shi, S. Feng, L. Shi, D. Shi, Y. Zhang, and H. Zhu, Junction Temperature Measurement Method for Power mosfets Using Turn-On Delay of Impulse Signal, IEEE Transactions on Power Electronics, vol. 33, No. 6, pp. 5274-5282, 2018.

F. Yang, E. Ugur, and B. Akin, Evaluation of Aging Effect on Temperature-Sensitive Electrical Parameters in SiC MOSFETs, IEEE Transactions on Power Electronics, vol. 35, No. 6, pp. 6315-6331, 2020.

P. Sun, C. Gong, X. Du, Q. Luo, H. Wang, and L. Zhou, Online Condition Monitoring for Both IGBT Module and DC-Link Capacitor of Power Converter Based on Short-Circuit Current Simultaneously, IEEE Transactions on Industrial Electronics, vol. 64, No. 5, pp. 3662-3671, 2017.

M. Du, J. Xin, H. Wang, Z. Ouyang, and K. Wei, Estimating Junction Temperature of SiC MOSFET Using Its Drain Current During Turn-On Transient, IEEE Transactions on Electron Devices, vol. 67, No. 5, pp. 1911-1918, 2020.

H. Li, X. Liao, Y. Hu, Z. Zeng, E. Song, and H. Xiao, Analysis of SiC MOSFET di/dt and Its Temperature Dependence, IET Power Electronics, vol. 11, No. 3, pp. 491-500, 2018.

M. Hasanuzzaman, S. K. Islam, L. M. Tolbert, and M. T. Alam, Temperature Dependency of MOSFET Device Characteristics in 4H-and 6H-Silicon Carbide (SiC), Solid-State Electronics, vol. 48, No. 10-11, pp. 1877-1881, 2004.

M. Farhadi, F. Yang, S. Pu, B. T. Vankayalapati, and B. Akin, Temperature-Independent Gate-Oxide Degradation Monitoring of SiC MOSFETs Based on Junction Capacitances, IEEE Transactions on Power Electronics, vol. 36, No. 7, pp. 8308-8324, 2021.

I. Filanovsky and A. Allam, Mutual Compensation of Mobility and Threshold Voltage Temperature Effects With Applications in CMOS Circuits, IEEE Transactions on Circuits and Systems I: Fundamental Theory and Applications, vol. 48, No. 7, pp. 876-884, 2001.

* cited by examiner

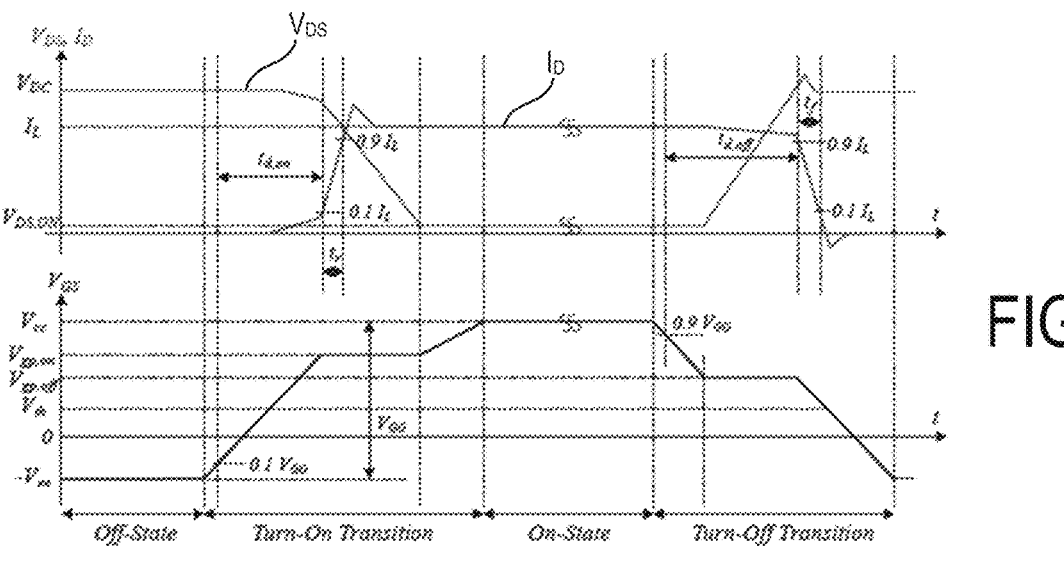
FIG. 1
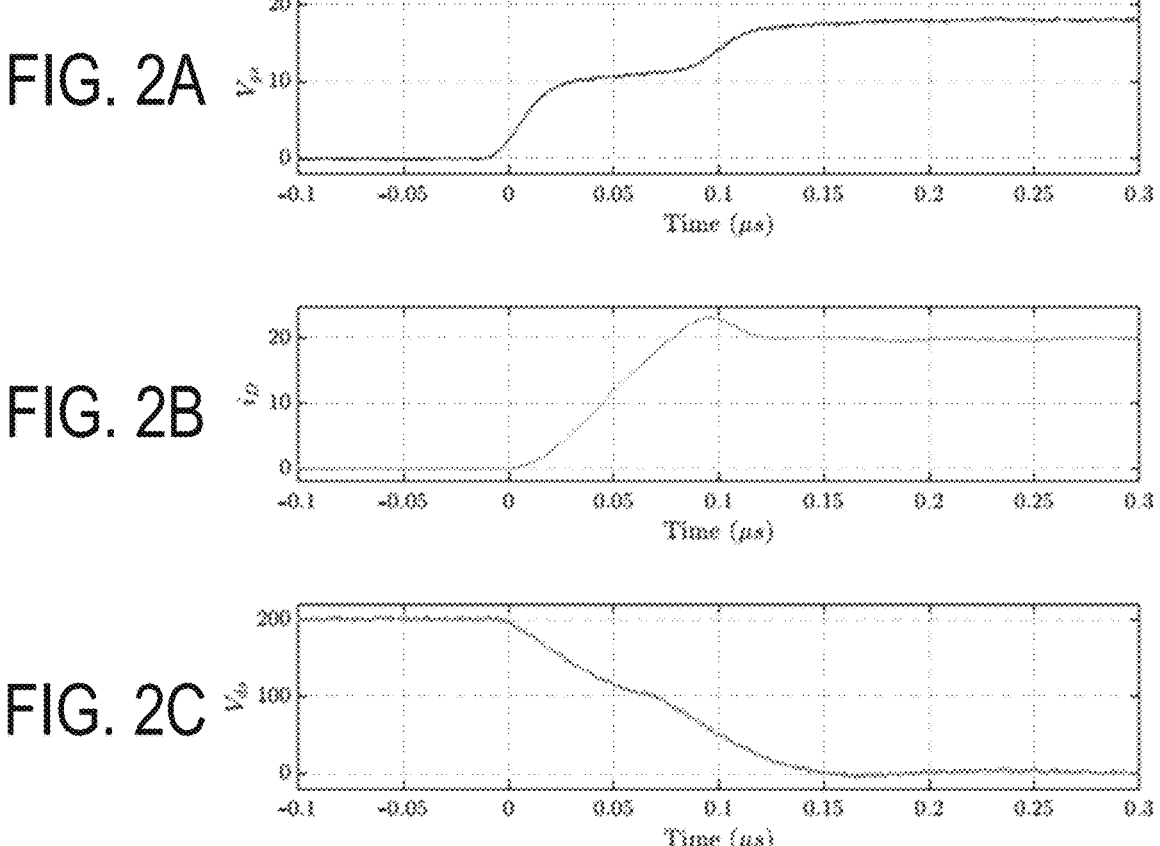
FIG. 2A
FIG. 2B
FIG. 2C

FIG. 7A
FIG. 7B
FIG. 7C
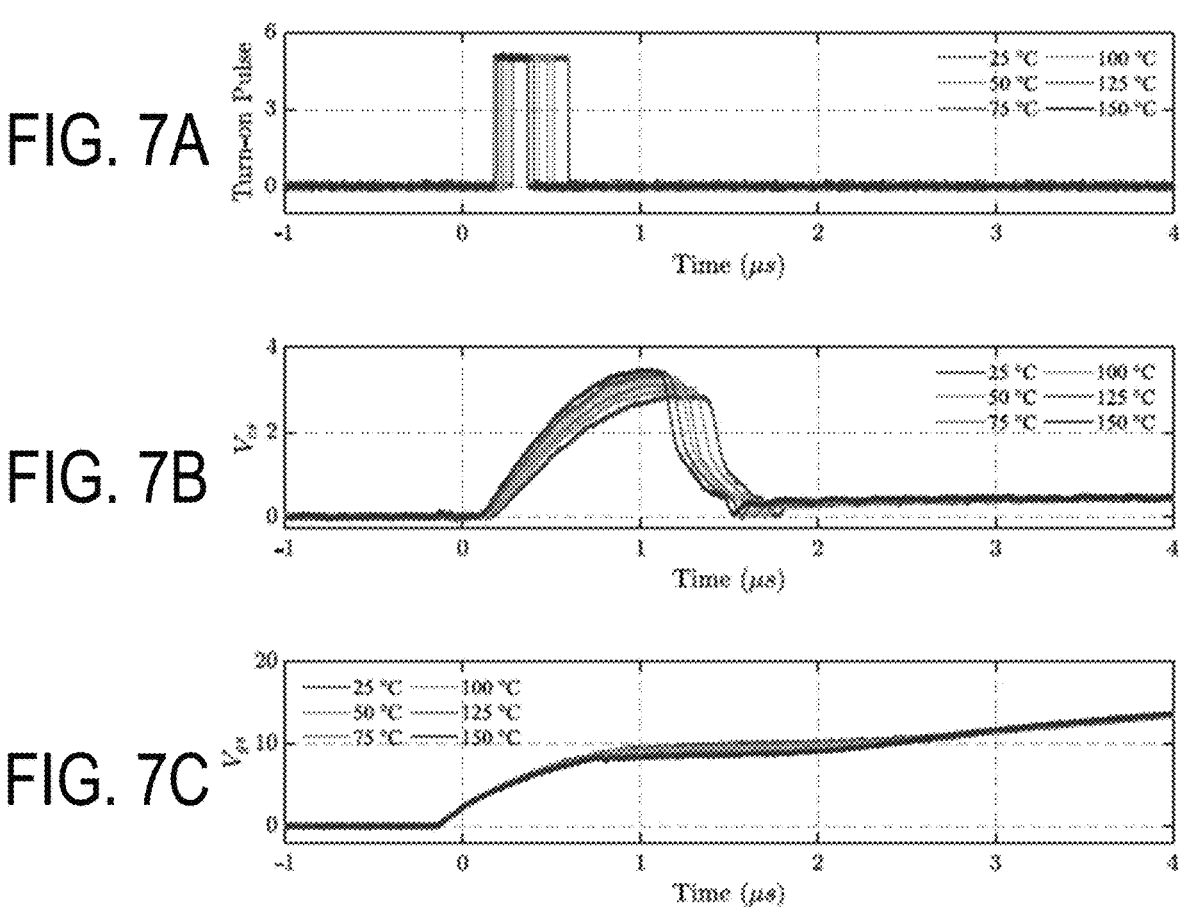
FIG. 8
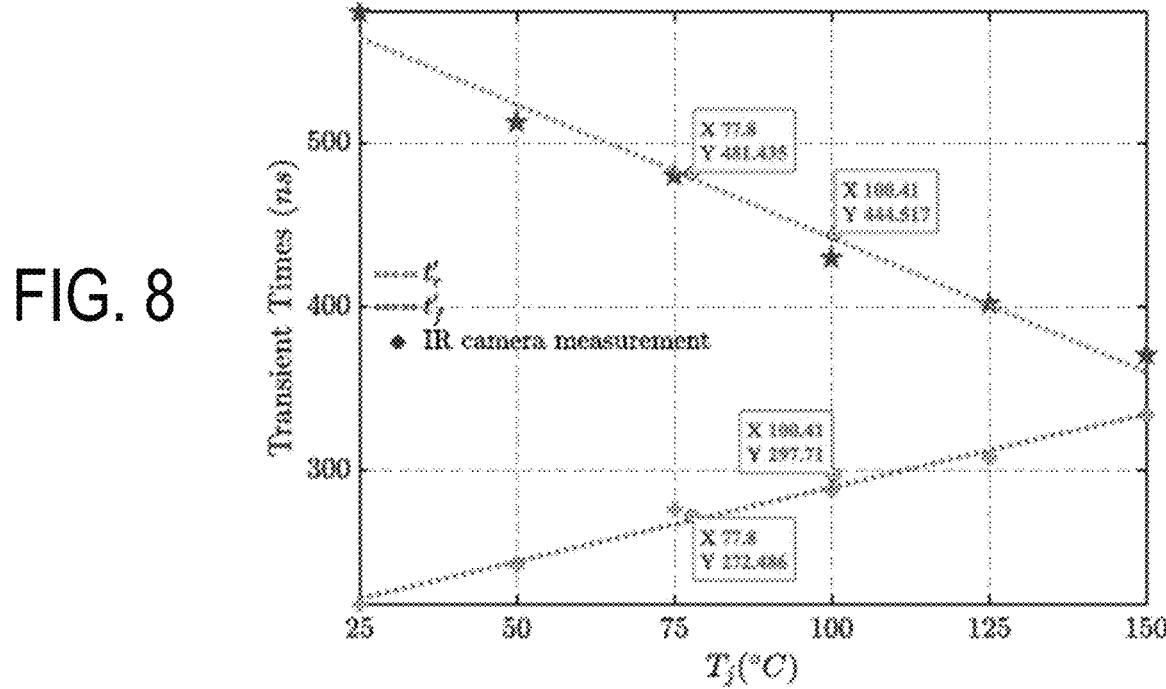

(a)

(b)

1500

| COMMUNICATE FIRST CONTROL SIGNAL TO APPLY A GATE RESISTANCE TO A MOSFET | ~ 1502 |

| COMMUNICATE SECOND CONTROL SIGNAL TO CAUSE A SWITCHING PHASE THAT INDICUS IN A SWITCHING TRANSIENT | ~ 1504 |

| OBTAIN A FIRST PULSE SIGNAL WITH A FIRST PULSE WIDTH PROPORTIONAL TO A RISE TIME DURATION OF THE SWITCHING TRANSIENT | ~ 1506 |

| OBTAIN A SECOND PULSE SIGNAL WITH A SECOND PULSE WIDTH PROPORTIONAL TO A FALL TIME DURATION OF THE SWITCHING TRANSIENT | ~ 1508 |

| DETERMINE FIRST AND SECOND ESTIMATES OF A JUNCTION TEMPERATURE OF THE MOSFET BASED ON THE FIRST AND SECOND PULSE WIDTHS | ~ 1510 |

| DETERMINE A REMAINING USEFUL LIFE OF THE MOSFET BASED ON THE FIRST ESTIMATE, THE SECOND ESTIMATE, AND A USEFUL LIFE FUNCTION | ~ 1512 |

FIG. 15

SWITCHING TRANSIENT BASED JUNCTION TEMPERATURE ESTIMATION OF SIC MOSFETS WITH AGING COMPENSATION

RELATED APPLICATIONS

The application claims priority benefit to U.S. Provisional App. No. 63/584,550, filed Sep. 22, 2023, entitled "Switching Transient Based Junction Temperature Estimation of SiC MOSFETs with Aging Compensation," which is hereby incorporated by reference in its entirety.

FIELD

The present disclosure relates to the field of semiconductor device temperature measurement, and more particularly to assessing a junction temperature of SiC MOSFETs through the online analysis of switching transients, while accounting for device aging.

BACKGROUND

Silicon carbide (SiC) metal-oxide-semiconductor field-effect transistors (MOSFETs) offer advantages such as higher switching speed, higher temperature capability, and lower losses, making them a suitable choice for various power electronics applications. Online junction temperature measurement has its merits for these devices. First, such measurement provides real-time feedback on the device's temperature, consistent with the high-temperature operation of SiC MOSFETs. Second, indicators like threshold voltage and on-state resistance have temperature-dependent properties. Accordingly, temperature measurement can be useful for monitoring these indicators for potential issues. Furthermore, monitoring temperature can offer information useful for designing more effective heat dissipation systems, contributing to enhanced power management and extended device lifetimes.

Different junction temperature measurement methods can be classified into three categories: on-chip temperature sensors, estimation based on thermal impedance, and methods that rely on temperature-sensitive electrical parameters (TSEPs). Among these solutions, TSEPs are frequently employed for junction temperature measurement due to their cost-effectiveness, non-invasiveness, and ease of integration into existing systems. They can provide an indirect indication of the junction temperature without requiring device or package modifications.

SUMMARY

Disclosed herein is an apparatus for estimating the junction temperature of a MOSFET by capturing and transforming switching transients that occur during the MOSFET's switching phase. The apparatus can include a measurement circuit electrically coupled to a source path of the MOSFET. The measurement circuit can be configured to capture a switching transient across a stray inductive element located at the source path of the MOSFET during a switching phase of the MOSFET. The switching transient can be characterized by a rise time or a fall time. The measurement circuit can be configured to transform the switching transient into a pulse characterized by a pulse width. The pulse width can be proportional to the duration of at least a portion of the rise time or the fall time. A processor can estimate a junction temperature of the MOSFET based on the pulse width and pre-established correlations between rise times and/or fall times and junction temperatures.

The apparatus of the previous paragraph can include any of the steps or features of this paragraph. The switching transient can be characterized by the rise time and the fall time. The pulse can include a set of pulses including a first pulse and a second pulse. The first pulse can be characterized by a first pulse width that can be proportional to the duration of the rise time. The second pulse can be characterized by a second pulse width that can be proportional to the duration of the fall time. The processor can estimate a first estimate of the junction temperature of the MOSFET based on the first pulse width and/or can estimate a second estimate of the junction temperature of the MOSFET based on the second pulse width.

The apparatus of any of the preceding paragraphs can include any of the steps or features of this paragraph. The apparatus can include an auxiliary switch circuit electrically coupled to a gate path of the MOSFET. The auxiliary switch circuit can be configured to insert a gate resistance into the gate path for a defined temporal interval. The insertion of the gate resistance can modulate the switching transient, thereby enabling the measurement circuit to capture the switching transient by aligning temporally with occurrence of the switching transient. The insertion of the gate resistance can be timed to coincide with the switching phase of the MOSFET. The defined temporal interval can be less than a single switching cycle of the MOSFET. The defined temporal interval can be approximately 2 microseconds.

The apparatus of any of the preceding paragraphs can include any of the steps or features of this paragraph. The switching phase can be an activation phase that corresponds to the MOSFET transitioning from an off-state to an on-state. The pulse width can be proportional to the duration of the rise time. The switching phase can be a deactivation phase that corresponds to the MOSFET transitioning from an on-state to an off-state. The pulse width can be proportional to the duration of the fall time. To capture the switching transient, the measurement circuit can detect a voltage drop across the stray inductive element located at a source terminal of the MOSFET. The switching transients can correspond to rapid changes in current and voltage that occur when the MOSFET turns on or off. The apparatus can include a processor configured to analyze the pulse width to yield an estimate of the junction temperature of the MOSFET. The stray inductive element can include parasitic inductance originating from a geometric configuration or a spatial arrangement of circuit components, conductive traces, or interconnections in proximity to the MOSFET.

The apparatus of any of the preceding paragraphs can include any of the steps or features of this paragraph. The measurement circuit can include a high input impedance buffer electrically coupled to the source path. The high input impedance buffer can be configured to measure a voltage at a source terminal. The measurement circuit can include an RC filter circuit electrically coupled to the high input impedance buffer. The RC filter circuit can be configured to attenuate noise attributes resulting from power loop parasitic inductance. The measurement circuit can include a comparator circuit configured to invert and amplify a signal output the RC filter circuit. The reference values of comparators of the comparator circuit can be selected to capture an initial ramp of the source voltage during the switching transient. The measurement circuit can include a flip-flop logic circuit electrically coupled to the comparator circuit. The flip-flop logic circuit can be configured to attenuate noise attributes by responding to an initial edge of the captured transient and resetting after completion of each individual measurement. The measurement circuit can include an AND logic circuit electrically coupled to the flip-flop logic circuit. The AND logic circuit can be configured to generate the pulse. The apparatus can include a controller coupled to the AND logic circuit, the controller can include a High-Resolution Capture (HR-Cap) module. The controller can be configured to measure a time duration of the pulse and estimate the junction temperature of the MOSFET. The MOSFET can be a silicon carbide (SIC) MOSFET.

Disclosed herein is a processor for managing switching transients in a SiC MOSFET to estimate junction temperature and/or assess its remaining useful life. The processor can be configured to communicate a first control signal to an auxiliary switch circuit electrically coupled to a gate path of a silicon carbide (SiC) metal-oxide-semiconductor field-effect transistor (MOSFET). The first control signal can cause the auxiliary switch circuit to insert a gate resistance into the gate path for a defined temporal interval that can be less than a single switching cycle of the SiC MOSFET. The processor can be configured to communicate a second control signal to modify a gate-source voltage to cause a switching phase of the SiC MOSFET to occur concurrently with the defined temporal interval. The switching phase can induce a switching transient across a stray inductive element located at a source path of the SiC MOSFET during a switching phase of the SiC MOSFET. The switching transient can be characterized by a rise time or a fall time. The processor can be configured to obtain a pulse signal characterized by a pulse width. The pulse width can be proportional to a duration of the rise time or the fall time. The processor can be configured to determine an estimate of a junction temperature of the SiC MOSFET based on the pulse width.

The processor of the previous paragraph can include any of the steps or features of this paragraph. The pulse signal can be a first signal, the pulse width can be a first pulse width proportional to the duration of the rise time, and the estimate can be a first estimate. The processor can be configured to obtain a second pulse signal characterized by a second pulse width. The second pulse width can be proportional to the duration of the fall time. The processor can be configured to determine a second estimate of the junction temperature based on the second pulse width. The processor can be configured to determine a remaining useful life of the SiC MOSFET based on first estimate, the second estimate, and a useful life function. The useful life function can include aging coefficients. The aging coefficients can be correlated to observed variations in switching transient times during turn-on and/or turn-off events.

The inventive concepts disclosed herein can relate to an online method for measuring the junction temperature (Tj) of SiC MOSFETs. Voltage spikes in the common source stray inductance can be captured to obtain the turn-on and turn-off switching transients of SiC MOSFETs. These switching transients can include information relevant to temperature and can be utilized to extract the junction temperature. By capturing turn-on and turn-off switching transients, the inventive concepts can effectively address the impact of aging on the online junction temperature measurement procedure. The inventive concepts can enable the measurement of junction temperature without the use of high bandwidth current sensors. For enhancing measurement accuracy, the inventive concepts can convert the captured voltage spikes into digital signals with defined pulse width, which can be measured by a high-resolution capture module in a microcontroller with an error margin below 1° C. Furthermore, the disclosed circuit can be integrated into existing gate driver ICs with little or no impact on the normal operation of the converter.

BRIEF DESCRIPTION OF THE DRAWINGS

The present disclosure is illustrated by way of example, and not limitation, in the figures of the accompanying drawings, in which like reference numerals indicate similar elements.

FIG. 1 shows the idealized turn-on and turn-off switching transients for SiC MOSFETs, detailing the variations in gate-source voltage and drain current during these processes.

FIGS. 2A-2C provide graphical representations of an example turn-on switching transient for a SiC MOSFET, as captured through the variations in gate-source voltage, drain current, and drain-source voltage, respectively.

FIGS. 7A-7C display example waveforms captured during the turn-on transient phase at various junction temperatures. Specifically, FIGS. 7A-7C depict the turn-on transient pulse, the common source voltage, and the gate-source voltage, respectively.

FIG. 8 displays the accuracy verification process for the junction temperature measurement, contrasting the infrared camera monitoring method with the pulse width measurement.

FIG. 15 is a flow diagram illustrative of an embodiment of a routine, implemented by a computing device, for managing switching transients in a SiC MOSFET to estimate junction temperature and assess its remaining useful life.

DETAILED DESCRIPTION

Figures 3A, 3B, 3C:
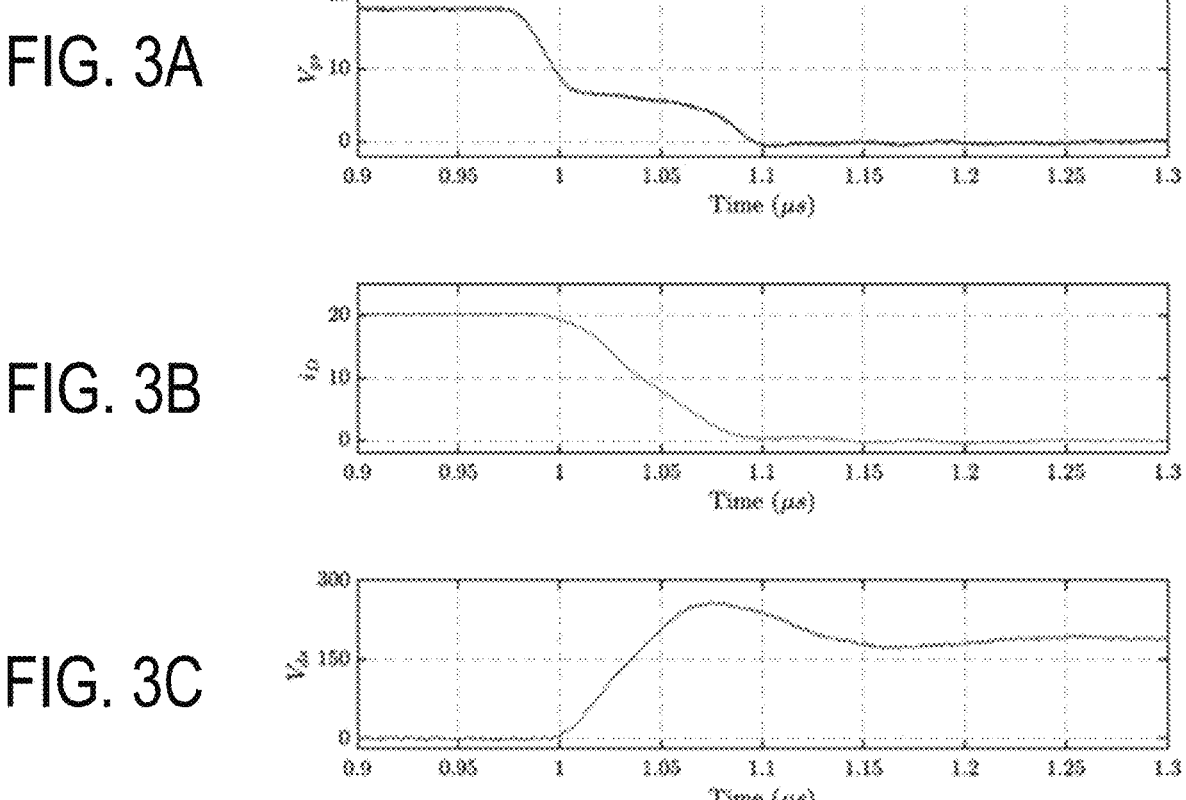
FIGS. 3A-3C provide graphical representations of an example turn-off switching transient for a SiC MOSFET, as captured through the variations in gate-source voltage, drain current, and drain-source voltage, respectively.

Different TSEPs have been reported for junction temperature measurement. The measurement of MOSFET junction temperature using the on-resistance ($R_{DS,ON}$) has been discussed. The temperature dependence of $R_{DS,ON}$ can be attributed to the temperature dependency of two components: channel resistance and drift region resistance. Channel resistance typically decreases with increasing temperature owing to an increase in channel mobility ($\mu_{ch}$), whereas drift region resistance tends to increase due to lattice vibration. Consequently, $R_{DS,ON}$ can exhibit either a positive or negative temperature coefficient, depending on the interplay between these two resistances. Based on vendor datasheets, the on-resistance of MOSFETs shows a tendency to increase non-linearly with temperature, making it challenging to use as an indicator of junction temperature. Moreover, the on-resistance of SiC MOSFETs is typically in the range of a few milliohms, making the measurement of minor changes in on-resistance challenging. The threshold voltage ($V_{th}$) has been suggested as a parameter to measure junction temperature, given its sensitivity and linear correlation with temperature. However, measuring Vth during converter operation can involve high-resolution ADC and noise cancellation techniques, which may limit its applicability as a solution. The peak gate current observed during the turn-on delay period has been demonstrated as a TSEP to measure the junction temperature. This approach can have particular requirements on device manufacturing and is limited to certain SiC MOSFETs with controlled gate designs. The turn-on and turn-off delay times have been identified as TSEPs to measure the junction temperature. These TSEPs have been adopted for real-time junction temperature measurement with acceptable linearity. By utilizing intelligent gate drivers and relatively high gate resistance, the sensitivity of these TSEPs can be improved. The linearity and sensitivity of the body diode voltage can also be used for the same purpose at low current injection, which can be achieved in reliability test setups but may not be straightforward for converter operations. The short circuit current shows a linear relationship with the junction temperature and can be employed as a TSEP. However, caution should be exercised as self-heating effects may influence the accuracy of the measurement and contribute to package aging. Turn-on switching transient has been used as a TSEP, and oscilloscope measurements indicate acceptable sensitivity and linearity. The practical implementation of this method is challenging due to the high switching frequency of SiC MOSFETs, and the online implementation of this method has not been thoroughly examined.

Conventionally, it has been presumed that the temperature dependency of temperature-sensitive electrical parameters (TSEPs) remains constant throughout the lifetime of a device. Contrary to this assumption, factors such as the deterioration of gate oxide and package degradation can significantly influence TSEPs. In light of these considerations, integrating an aging compensation scheme into circuits that employ TSEPs for temperature measurement can be advantageous.

To address these or other challenges, the inventive concepts presented here offer techniques for online junction temperature measurement that can take consider the entire signal chain. The inventive concepts relate to the utilization of the rise time and/or fall time of SiC MOSFETs as temperature-dependent parameters. These parameters can show a considerable degree of sensitivity to temperature changes. Furthermore, the inventive concepts can relate to the aging dependency of these temperature-dependent parameters, such as by performing an active channel gate bias test. This allows for the distinction between the effects of temperature and aging by measuring the switching transient time during both the turn-on and turn-off processes. Additionally, a circuit design is introduced for the online measurement of switching transients, thereby reducing the dependency on high bandwidth current sensors. This circuit can be integrated with little to no disruption into the standard operations of a power converter and is suitable for inclusion in gate driver integrated circuits.

While the present disclosure predominantly centers on methodologies and circuit designs tailored for SiC MOSFETs, it should be appreciated that the inventive concepts described herein are not confined to SiC MOSFETs but can be extended to a wide array of other transistor configurations and switching devices. For example, the methodologies and circuit designs can be adapted to accommodate Bipolar Junction Transistors (BJTs), Insulated-Gate Bipolar Transistors (IGBTs), and Gallium Nitride (GaN) High-Electron-Mobility Transistors (HEMTs), among others. Additionally, the inventive concepts are applicable to MOSFETs composed of various semiconductor materials other than SiC. Such materials include, but are not limited to, Silicon (Si), Gallium Arsenide (GaAs), and Indium Phosphide (InP) MOSFETs. Therefore, the inventive concepts articulated herein possess the flexibility to be employed in a diverse range of MOSFET architectures, thereby expanding their potential utility well beyond SiC-based configurations.

Temperature Effect on the Turn-On and Turn-Off Switching Transients

In this section, an explanation of the switching transients of SiC MOSFET is provided. Additionally, the influence of temperature on these switching transients is examined. More specifically, the analysis focuses on the correlation between the variation of $di_D/dt$ (e.g., the rate of change of drain current) and related parameters such as rise time and fall time, with respect to junction temperature. In the next sections, this analysis of the temperature dependency of rise time and fall time is applied to construct a composite TSEP with aging compensation. To be more precise, it utilizes the portions of the rise time ($t_r$) and fall time ($t_r$) during which the voltage drop across the common source exhibits a linear alteration. This approach is employed to facilitate a more convenient and accurate measurement of the junction temperature.

FIG. 1 shows the idealized turn-on and turn-off switching transients for SiC MOSFET. During the turn-on switching process, the gate-source voltage ($V_{GS}$) of the SiC MOSFET gradually increases from the negative gate supply voltage ($-V_{cc}$) to the positive gate supply voltage ($V_{cc}$). As $V_{GS}$ increases, the depletion layer starts to shrink, resulting in the formation of a conducting channel between the source and drain. First, the input capacitance is charged until $V_{GS}$ reaches the threshold voltage. During this turn-on delay stage, the drain current ($I_D$) and drain-source voltage ($V_{DS}$) remain unchanged. Once $V_{GS}$ reaches $V_{th}$, the MOSFET is turned on and $I_D$ will start to decrease. The gate-source voltage continues to rise until it reaches the Miller plateau voltage, at which point the reverse recovery current of the freewheeling diode starts to decrease from its peak value to zero, and $V_{DS}$ gradually decreases until it reaches the on-state voltage ($V_{DS,ON}$). Here, the Miller capacitance is charged, and the MOSFET is kept in the saturation region. Finally, as $V_{GS}$ reaches to $V_{cc}$, the MOSFET is fully turned on with $V_{DS}$ and $I_D$ at the load current which is shown in FIGS. 2A-2C. FIGS. 2A-2C provide graphical representations of an example turn-on switching transient for a SiC MOSFET, as captured through the variations in gate-source voltage, drain current, and drain-source voltage, respectively.

FIGS. 3A-3C depict the turn-off phase of the SiC MOSFET, focusing on the changes in gate-source voltage and the effects of the depletion layer on the conducting channel. In the turn-off phase of MOSFET, $V_{GS}$ is lowered from $V_{cc}$ to $-V_{cc}$, which leads to the widening of the depletion layer and shrinking of the conducting channel. However, due to the presence of energy stored in the inductive load, the drain current cannot instantly drop to zero, leading to a momentary increase in the voltage across the MOSFET and causing a reverse recovery current to flow through the freewheeling diode. This reverse recovery current may cause a brief over-shoot of the drain current before dropping to zero. Moreover, the circuit's parasitic capacitances can also contribute to the voltage across the MOSFET oscillating around $V_{DS,ON}$ as the MOSFET switches from the on-state to the off-state.

$di_D$/dt Temperature Dependency $di_D$/dt directly influences the rise time and fall time of the drain current. Rise time refers to the time it takes for the channel current to change from a relatively low level (e.g., 10%) to a relatively high level (e.g., 90%), whereas fall time represents the transition from a high level to a low level. A higher $di_D$/dt value corresponds to quicker rise and fall times, indicating a rapid transition between high and low current states. Conversely, a lower $di_D$/dt value indicates slower rise and fall times, signifying a more gradual transition. Given that the MOSFET is in the saturation region during switching transients, the drain current at the $t_r$ and $t_f$ time instants can be represented as:

$$i_D = \frac{\beta}{2}(V_{gs} - V_{th})^2(1 + \lambda(V_{gs} - V_{th})) \tag{1}$$

$$\beta = \frac{W_{\mu_0}C_{ox}}{L} \tag{2}$$

where the channel width is represented by W, the channel length is denoted by L, $\lambda$ signifies the channel length modulation parameter, $\mu_0$ is the effective carrier mobility of the channel, and $C_{OX}$ refers to the gate oxide capacitance of SiC MOSFET. The rate of change of the drain current with respect to time can be expressed as:

$$\frac{di_D}{dt} = \frac{\beta}{2}(V_{gs} - V_{th})(2 + 3\lambda(V_{gs} - V_{th}))\frac{dV_{gs}}{dt} \tag{3}$$

The following expressions can be used to attain $V_{gs}$ values for turn-on and turn-off transients:

$$V_{gs,on} = V_{cc}\left(1 - e^{-(t/R_gC_{iss})}\right) \tag{4}$$

-continued $$V_{gs,off} = V_{cc}e^{-(t/R_gC_{iss})} \tag{5}$$

The turn-on and turn-off $dI_D$/dt values can be obtained by differentiating equations (4) and (5) with respect to time and substituting the results into equation (3):

$$\frac{di_{D,on}}{dt} = \frac{\beta V_{cc}}{2R_gC_{iss}}A(2 + 3\lambda A)e^{-(t/R_gC_{iss})} \tag{6}$$

$$\frac{di_{D,off}}{dt} = -\frac{\beta V_{cc}}{2R_gC_{iss}}B(2 + 3\lambda B)e^{-(t/R_gC_{iss})} \tag{7}$$

where:

$$A = V_{cc}\left(1 - e^{-(t/R_gC_{iss})}\right) - V_{th} \tag{8}$$

$$B = V_{cc}e^{-(t/R_gC_{iss})} - V_{th} \tag{9}$$

To evaluate how temperature affects the current commutation rate, the derivative of equations (6) and (7) with respect to temperature can be calculated with respect to temperature. Two parameters that are affected by temperature in equations (6) and (7) are the threshold voltage and $\beta$. The value of $\beta$ is influenced by the effective mobility of the carriers present in the channel. $\beta$ in SiC MOSFETs demonstrates a non-linear relationship with temperature. At lower temperatures, $\beta$ increases, exhibiting a positive temperature coefficient. However, as the temperature increases further, $\beta$ starts to decrease and demonstrates a negative temperature coefficient. This is because the influence of lattice scattering dominates in this temperature range. Within the practical operational temperature range of 30-175° C., it can be assumed that $\beta$ remains relatively constant and maintains a positive value. As a result, it can be assumed that the effect of $\beta$ on the temperature dependence of the current commutation rate is negligible for SiC MOSFETs. In equations (6) and (7), the input capacitance ($C_{iss}$) is highly dependent on the voltage across the drain and source terminals. In practical scenarios, this voltage is equal to the DC bus voltage, which remains constant.

The threshold voltage can be a minimum voltage required at the gate terminal to turn on the device and establish a conducting channel between the source and drain terminals. It can be challenging to calculate the temperature dependence of the threshold voltage theoretically because it is a function of several parameters, and there is limited information available from manufacturers regarding the fabrication parameters. However, this temperature dependency can be achieved through experimental results. Threshold voltage shows a negative temperature coefficient. Temperature dependency of $di_D$/dt during turn-on and turn-off can be expressed as:

$$\frac{d^2I_{D,on}}{dtdT} = -\frac{\beta V_{cc}}{2R_gC_{iss}}(2 + 6\lambda A)e^{-(t/R_gC_{iss})}\frac{dV_{th}}{dT} \tag{10}$$

$$\frac{d^2I_{D,off}}{dtdT} = -\frac{\beta V_{cc}}{2R_gC_{iss}}(2 + 6\lambda B)e^{-(t/R_gC_{iss})}\frac{dV_{th}}{dT} \tag{11}$$

The temperature dependence of di/dt during turn-on and turn-off in SiC MOSFETs can be deducted by considering the positive value of beta and negative value of $dV_{th}/dT$. Specifically, the temperature dependency of $di_D/dt$ for SiC MOSFETs during turn-on is positive, while during turn-off, it is negative. Consequently, the temperature dependence of rise time and fall time for SiC MOSFETs is found to be negative and positive, respectively. However, for silicon MOSFETs, the rise time is either independent of temperature or increases as the temperature increases. The difference in temperature dependency between SiC MOSFETs and silicon MOSFETs can be attributed to $d\beta/dT$, which has a very low value in SiC MOSFETs, but it is negative in silicon MOSFETs.

Example Circuit for Switching Transients Measurement

This section introduces a new circuit to capture switching transients. The circuit utilizes the voltage drop across the common source stray inductance to accurately measure the rise and fall times of the SiC MOSFET. Despite the relatively small value of stray inductance, the voltage drop across the common source can be significant due to the SiC MOSFET's higher rate of change of drain current compared to a Si MOSFET. As a result, the voltage drop can become measurable. This voltage is specifically generated during switching transients, and it is observed that the spikes in the common source voltage have a duration that aligns with the switching transients. Also, it is demonstrated that modifying the gate resistance allows for the adjustment of sensitivity in order to achieve the desired resolution in capturing transient times.

Figure 4A:
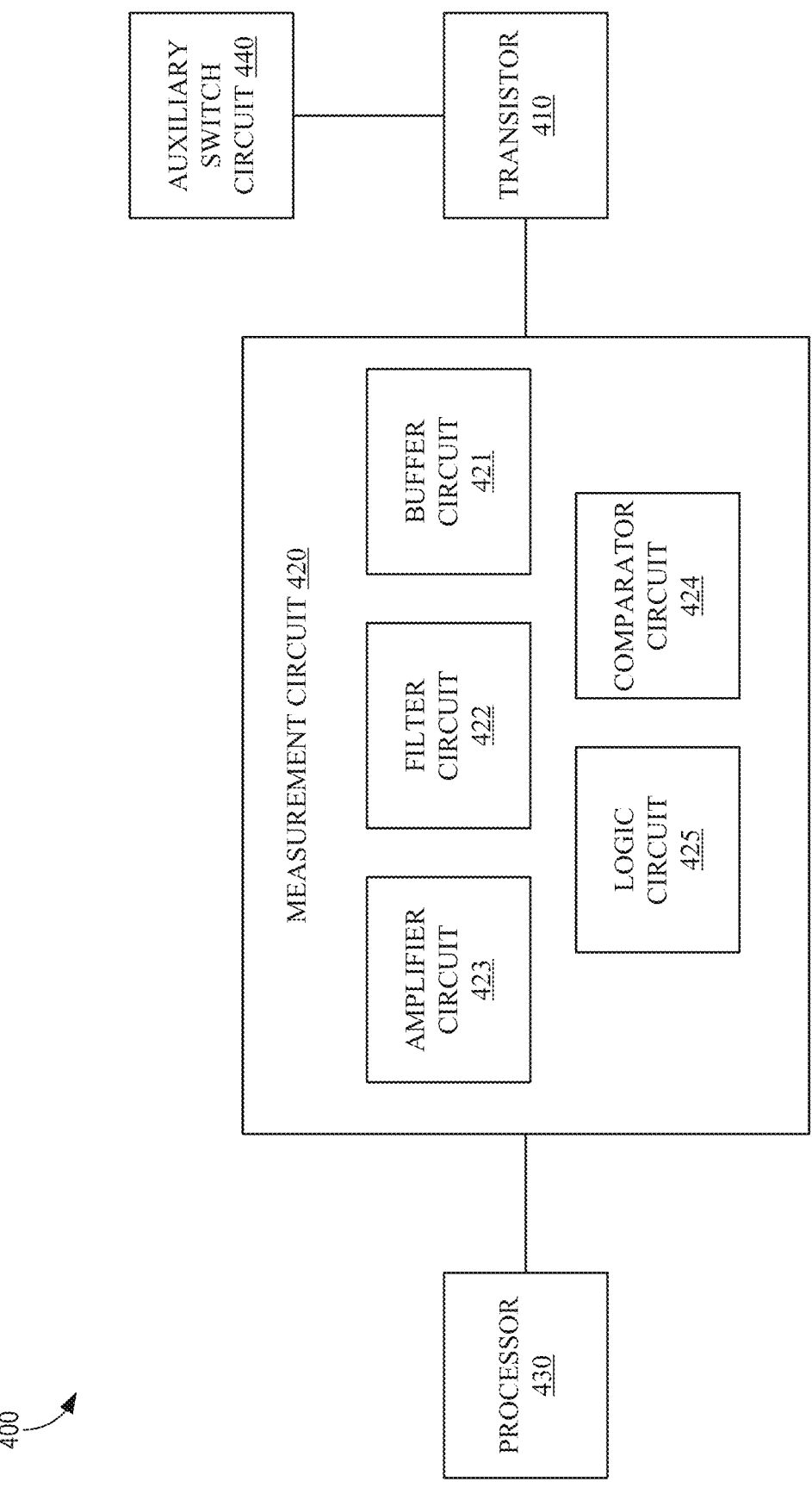
FIG. 4A illustrates an example circuit diagram of a circuit for capturing switching transients.

FIG. 4A illustrates an example circuit diagram of a system 400 for capturing switching transients. The system 400 includes a transistor 410, a measurement circuit 420, a processor 430, and an auxiliary switch circuit 440. The measurement circuit 420 includes a buffer circuit 421, a filter circuit 422, an amplifier circuit 423, a comparator circuit 424, and a logic circuit 425. It will be appreciated that the system 400 and/or the measurement circuit 420 can include fewer, more, or different components, depending on the embodiment.

Figure 4B:
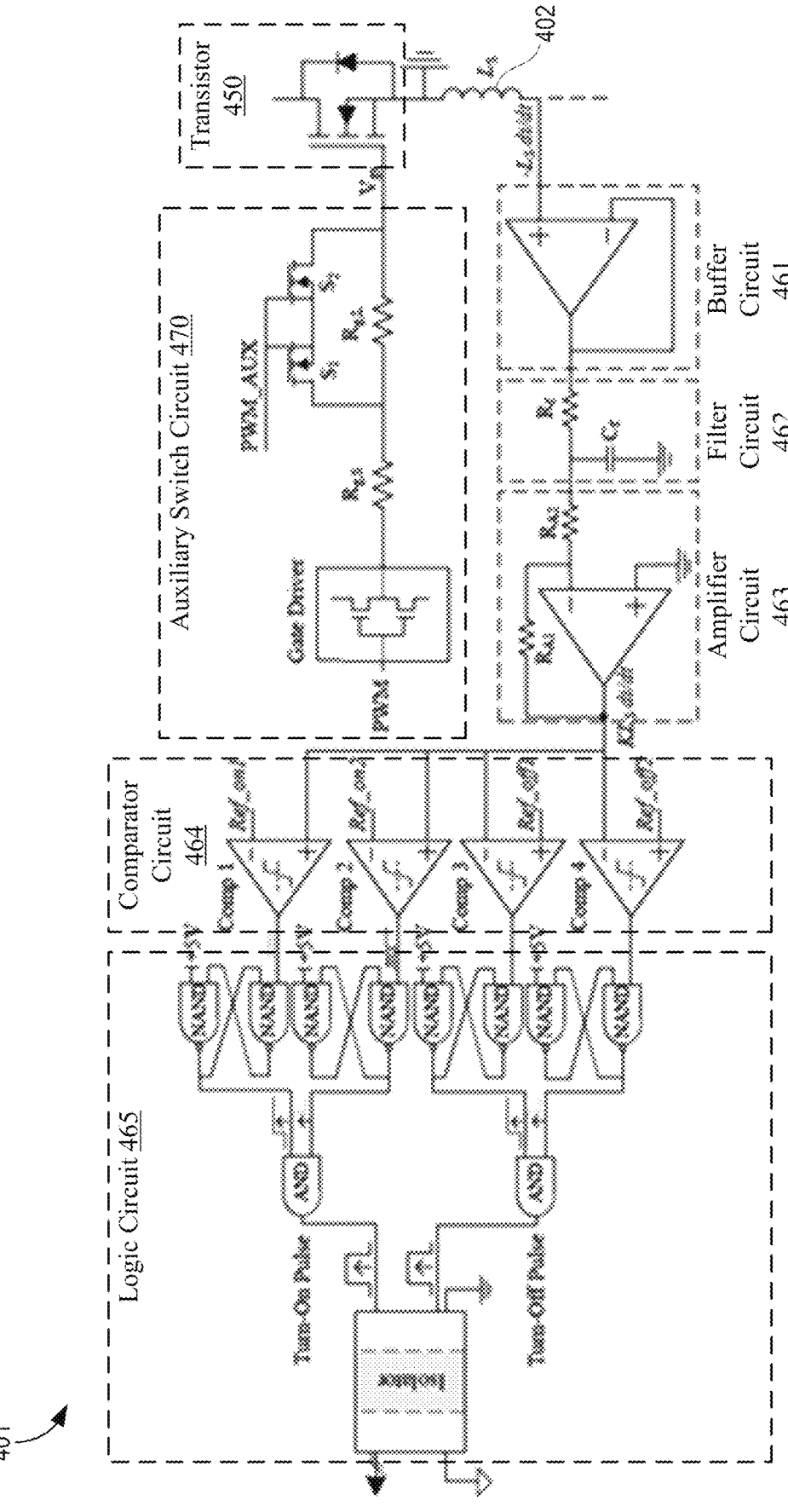
FIG. 4B illustrates an example circuit diagram of a circuit for capturing switching transients.

FIG. 4B illustrates an example circuit diagram of a system 401 for capturing switching transients, which can be an embodiment of the system 400 of FIG. 4A. The system 401 includes a transistor 450, a buffer circuit 461, a filter circuit 462, an amplifier circuit 463, a comparator circuit 464, a logic circuit 465, a processor 430, and an auxiliary switch circuit 470, which can be embodiments of the transistor 410, the buffer circuit 421, the filter circuit 422, the amplifier circuit 423, the comparator circuit 424, the logic circuit 425, and the auxiliary switch circuit 440, respectively.

The ensuing discussion elaborates on FIG. 4B; however, it should be appreciated that the concepts and methodologies described are also applicable to 4A. FIG. 4B shows a system 401 including an example circuit for capturing switching transients. For conducting the switching transient measurement, initially, a large gate resistance ($R_{g,L}$) is inserted into the gate path for less than a single switching cycle, utilizing auxiliary switches ($S_1$, $S_2$) of the auxiliary switch circuit 470. Subsequently, the common source voltage is measured via a high input impedance buffer of the buffer circuit 461. The obtained voltage is directed through an RC filter of the filter circuit 462 to eliminate noise originating from power loop parasitic inductance and prevent erroneous operation of comparators of the comparator circuit 464. The input stage's gain can be obtained by:

$$\lim_{j\omega \to \infty} G(j\omega) = \frac{R_{A1}L_S}{R_{A2}R_fC_f} \qquad (12)$$

It should be noted that the careful selection of RC values in (12) can ensure suitable high-frequency operation. The subsequent step can include inverting and amplifying the signal using the amplifier circuit 463 while considering the input voltage limitations imposed by the comparators. The reference values of the comparators of the comparator circuit 464 can be selected to accurately capture the initial ramp of the common source voltage during both turn-on and turn-off transients. The captured times can correspond to a fraction of the overall rise and fall times. As a result of conducting the measurement under high gate resistance, the captured fraction of the rise and fall times ($t'_r$, $t'_f$) retains the capability to offer highly precise temperature measurements. In some cases, the insertion of the large gate resistance occurs only for a brief duration of less than one switching cycle. Following this, the circuit can promptly return to its regular operation until the next interrupt flag is received from the microcontroller for measurement. In some cases, this brief interruption does not have any adverse impact on the normal operation of the converter. The output signals from the comparators are fed into an SR flip-flop logic circuit of the logic circuit 465, which can include two NAND gates, serving the purpose of noise elimination. The flip-flops respond to the initial edge and can be reset after each measurement takes place. The output from the flip-flop logic is directed to an AND logic circuit of the logic circuit 465, which generates a pulse with a width corresponding to the duration of the switching transients. Although the common source voltage can be measured using a microcontroller's ADC, the disclosed voltage conversion method can transform this voltage into pulses with a specific width. The time duration of these pulses can be accurately measured using the C2000 microcontroller's High-Resolution Capture (HR-Cap) module, which provides a high resolution (e.g., 200 ps, 300 ps, or 400 ps). The disclosed circuit can be a comprehensive signal chain and can offer a cost-effective solution that can be seamlessly integrated into gate driver ICs.

To validate the accuracy of the disclosed circuit, a custom designed setup is utilized, offering the flexibility to be configured as either double pulse or buck circuits. The experimental setup can incorporate an inductor with a size of 650 µH, an output capacitor of 180 µF, and a switching frequency of 200 KHz in buck mode. Similar to other TSEP-based methods used for junction temperature measurement, this circuit requires an initial calibration during system start-up. However, what sets this circuit apart is its ability to compensate for the aging effect, eliminating the need for periodic recalibration like other TSEP-based methods, as further discussed in Section IV.

Figures 5A, 5B, 5C:
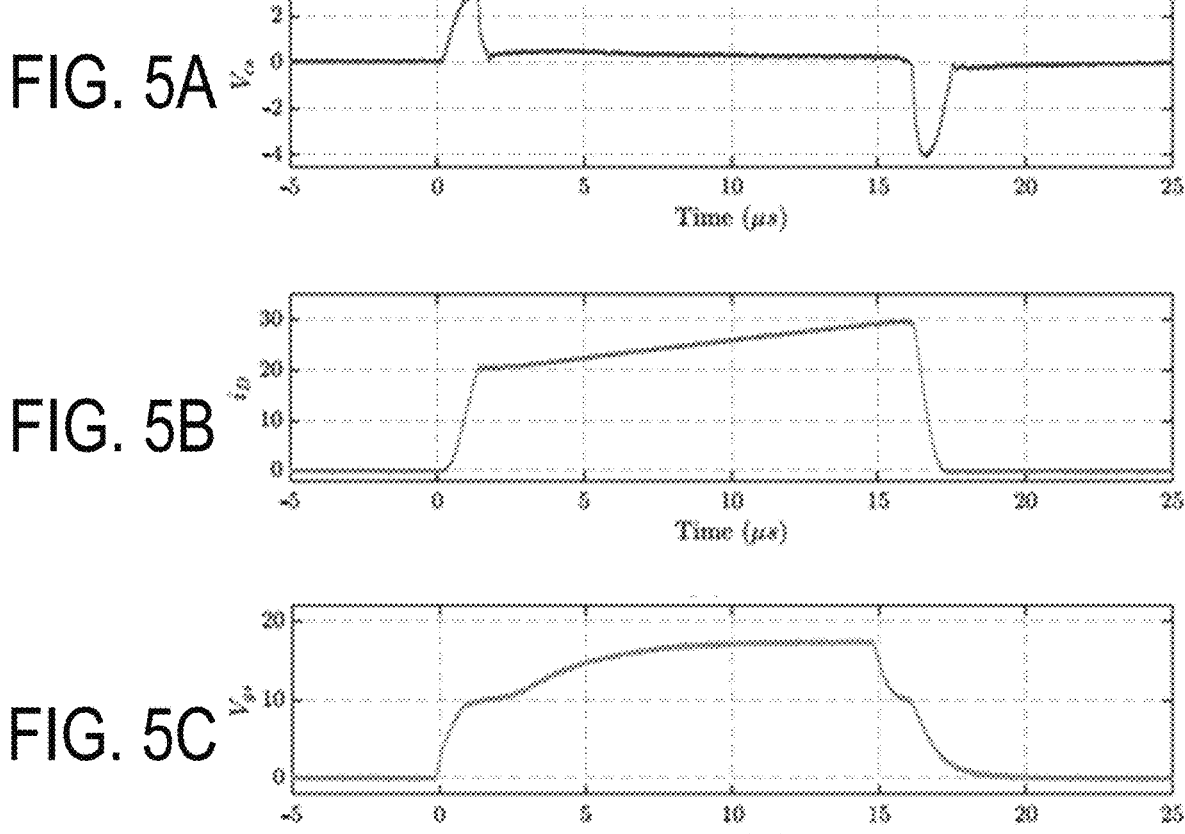
FIGS. 5A-5C display example waveforms of switching transients, illustrating variations in common source voltage drop, drain current, and gate-source voltage, respectively.
Figures 6A, 6B, 6C, 6D:
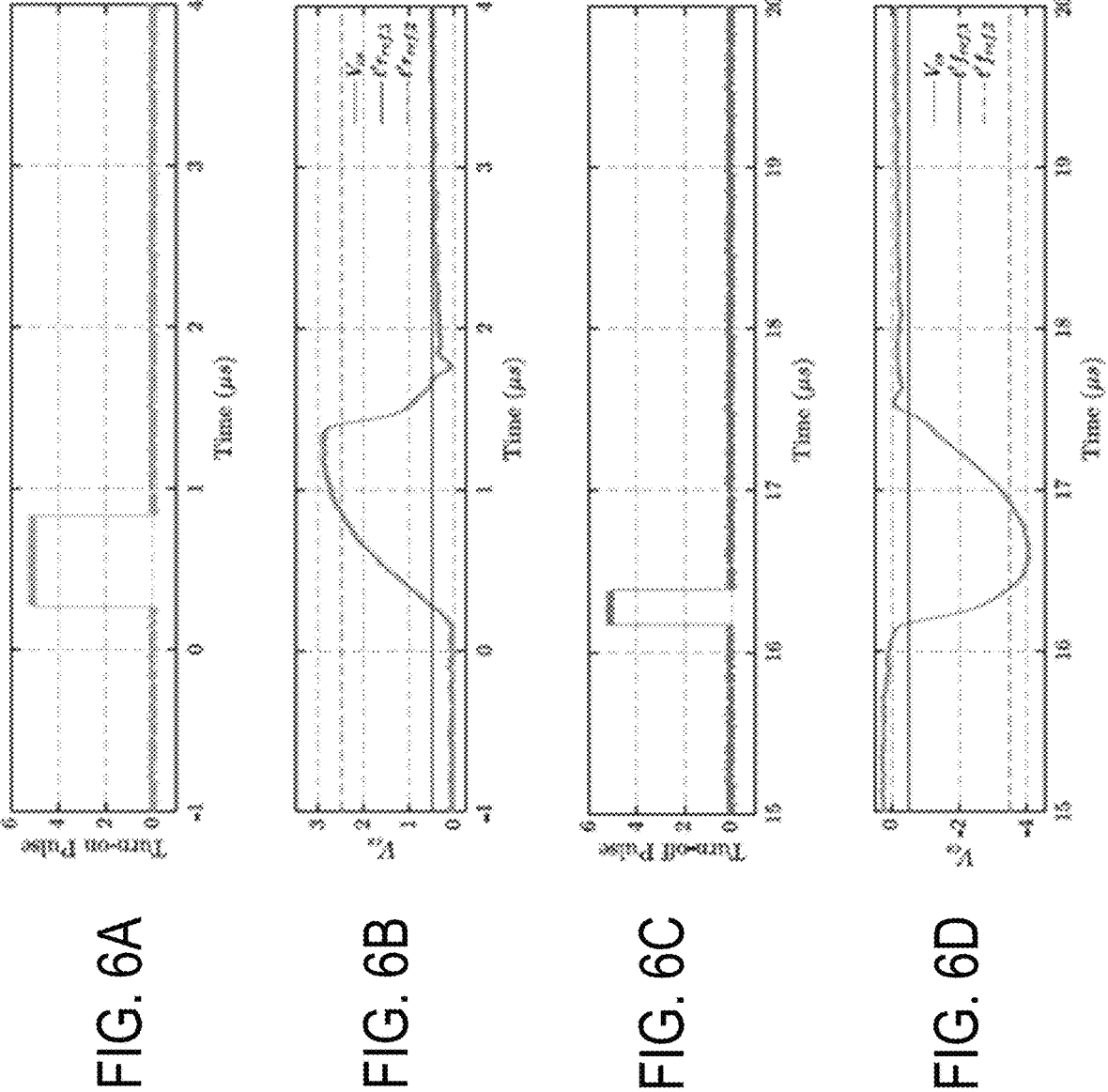
FIG. 6A displays a pulse waveform corresponding to the duration of the rising common source voltage during an example turn-on switching transient.
FIG. 6B displays the common source voltage and its associated reference values during an example turn-on switching transient.
FIG. 6C displays the pulse waveform representing the duration of the falling common source voltage during an example turn-off switching transient.
FIG. 6D displays the common source voltage and its associated reference values during an example turn-off switching transient.

FIGS. 5A-5C display the experimental waveforms obtained for the drain current, gate-source voltage, as well as the filtered and inverted common source voltage ($V_{sc}$). In real applications, the DC bus voltage remains constant, and therefore for these experiments, it is set to 200V. The circuit is operated using a gate resistance of 5Ω, and a 1KΩ resistance is inserted to capture the switching transients. As observed, $V_{sc}$ during turn-on and turn-off transients is approximately 3V and 4V, respectively. This voltage level is reasonably significant, making it suitable for capturing and measuring.

FIGS. 6A-6D illustrate the pulses representing the rise time and fall time. In this case, the comparator references are selected to capture the initial ramp in the switching transients. This ensures a strong linear correlation between the transient pulses and the junction temperature.

FIGS. 7A-7C display example waveforms captured during the turn-on transient phase at various junction temperatures. The $V_{sc}$ references are set at 0.5V and 2.5V to generate the rising edge and falling edge signals, respectively. To verify the precision of the disclosed circuit, the SiC MOSFET is decapsulated within the die area and directly monitored using an Infrared (IR) camera. In order to enhance the infrared radiation emissivity, the decapsulated area is coated with black paint and a layer of silicone conformal coating. This coating serves multiple purposes, including preventing electrical leakage, short circuits, and unintended electrical connections by providing insulation between conductive wires. Additionally, it acts as a protective barrier against moisture, dust, and other environmental factors.

FIG. 8 presents the accuracy verification of the junction temperature measurement circuit through direct monitoring of the die temperature using an infrared camera. The measured temperature is then compared with the temperature obtained from the pulse width measurement. Given that $t'_r$ and $t'_f$ vary approximately by 1.67 ns and 0.89 ns per degree, respectively, and taking into account the 300 ps resolution of the microcontroller's HR-Cap module, the circuit can measure the temperature with an error of less than 1° C.

Figure 9:
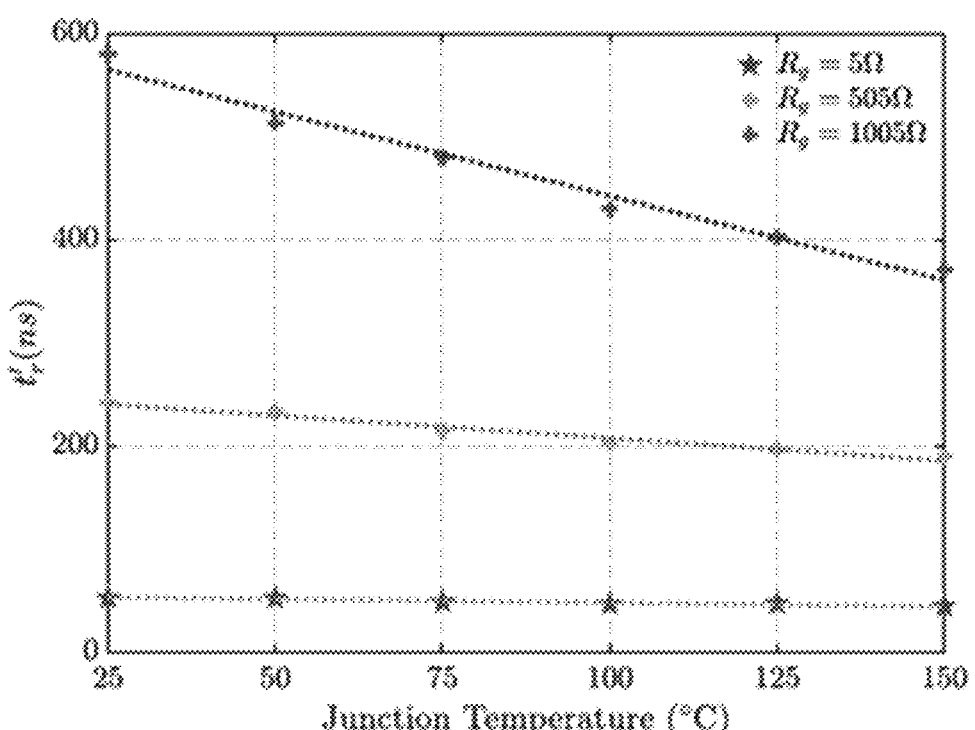
FIGS. 9 and 10 depict the relationship between the transient rise and fall times (t'r, t'f) and the junction temperature under different external gate resistances.
Figure 10:
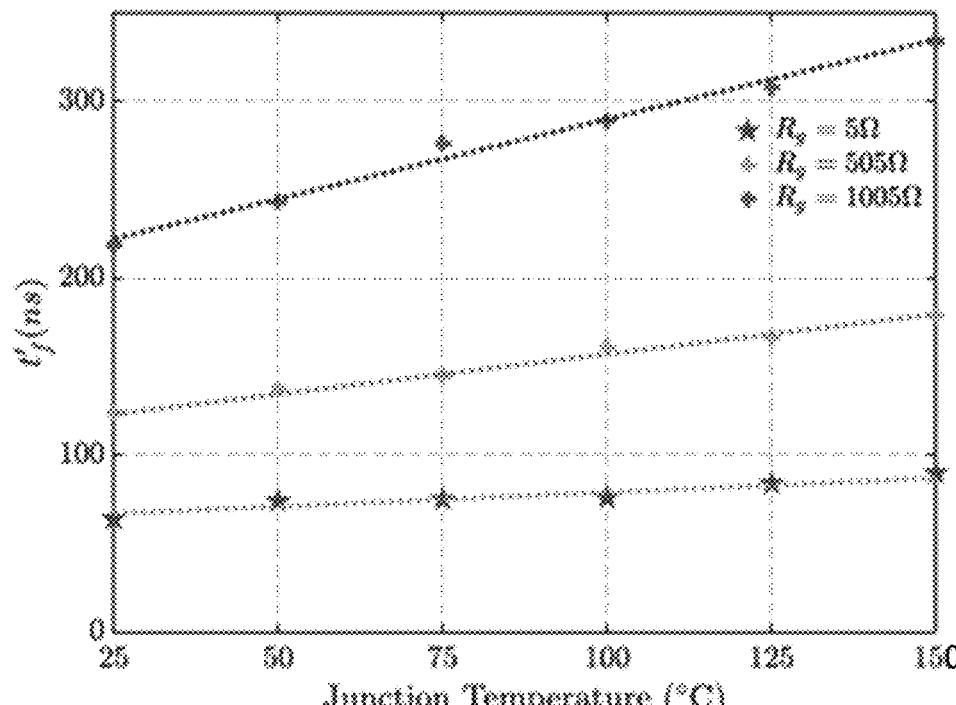
Figures 11A, 11B, 11C, 11D:
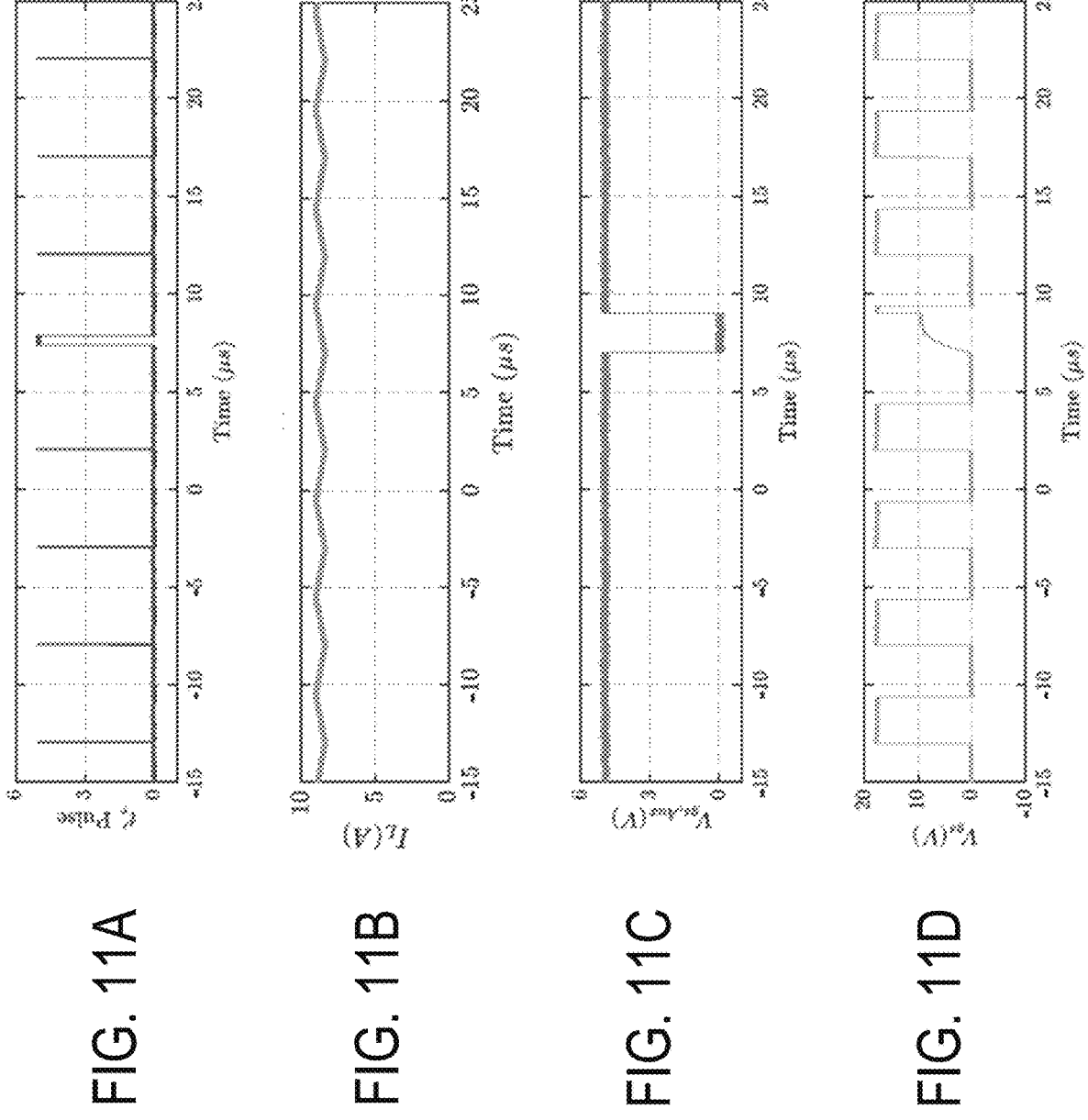
FIGS. 11A-11D show experimental waveforms captured by a switching transients measurement board during continuous operation of the converter with $V_{ds}$ maintained at 200V.
Figure 12A:
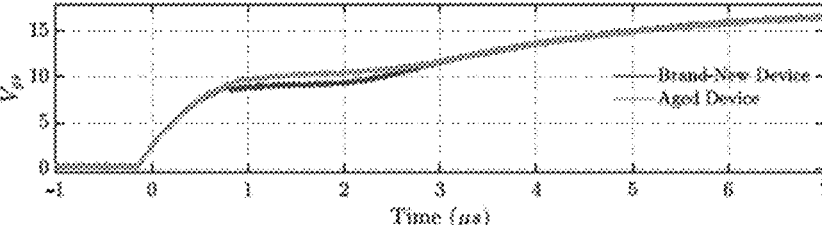
FIGS. 12A-12C and 13A-13C illustrate the impact of aging on the turn-on and turn-off switching transients during the ACGB test, focusing on parameters like gate plateau and delay times.
Figure 12B:
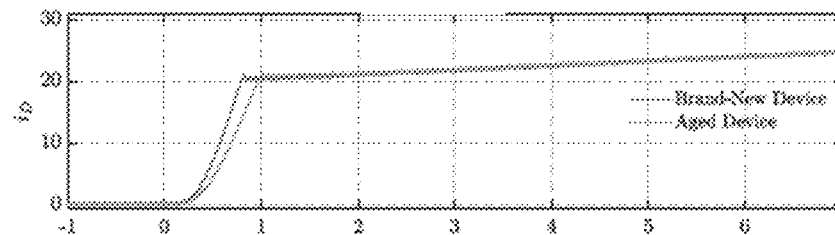
Figure 12C:
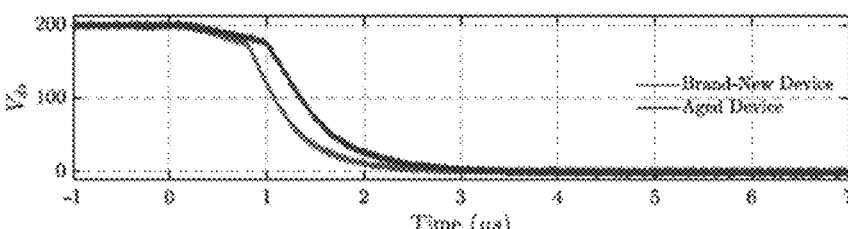
Figure 13A:
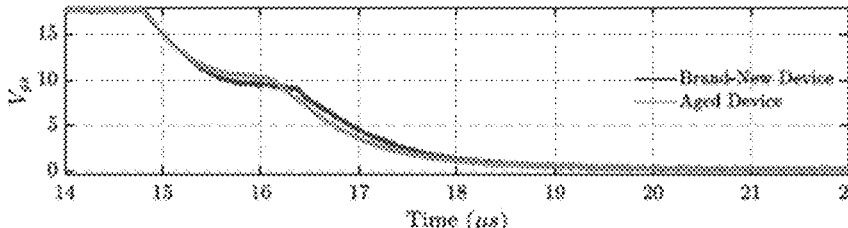
Figure 13B:
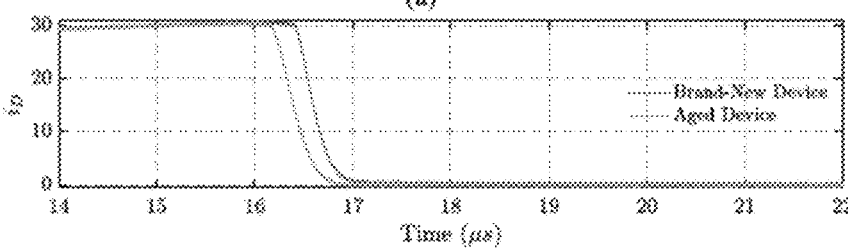
Figure 13C:
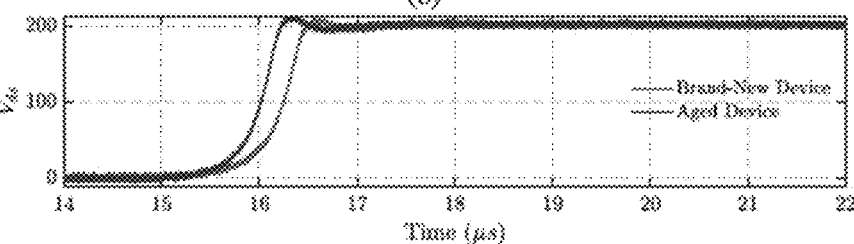

FIGS. 9 and 10 illustrate the correlation between $t'_r$ and $t'_f$ and junction temperature under various external gate resistances. Although the circuit can successfully capture switching transients with a low gate resistance, the insertion of a higher resistance can be important. This higher resistance enables significant observation of temperature-dependency and aging-dependency in the switching transients. Table I presents a summary of the linear regression parameters for $t'_r$ and $t'_f$ in relation to junction temperature under various gate resistances. While both $t'_r$ and $t'_f$ can be utilized for junction temperature measurement, it is observed that $t'_r$ exhibits higher sensitivity and is deemed more suitable for this purpose. Furthermore, the insertion of a large gate resistance prior to the turn-on transient is a more straightforward approach. For junction temperature monitoring, it is recommended to perform online measurement of $t'_r$. Periodically, the measurement of $t'_f$ can be conducted to recalibrate the temperature dependency lookup table for $t'_r$, which will be discussed in the subsequent section. In some cases, the measurement of $t'_f$ can be performed in-situ during system start-up.

TABLE I

| | Linear forecast parameters for $t'_r$ and $t'_f$ versus junction temperature at different gate resistances. | | | |
|---|---|---|---|---|
| $R_g$ | $t'_r$ slope | $t'_r$ value at 25° C. | $t'_f$ slope | $t'_f$ value at 25° C. |
| 5Ω | −72 ps/° C. | 53 ns | 4 ps/° C. | 67 ns |
| 505Ω | −436.8 ps/° C. | 240.1 ns | 453.6 ps/° C. | 123.1 ns |
| 1005Ω | −873.6 ps/° C. | 580.9 ns | 860.8 ps/° C. | 222.2 ns |

In order to verify the efficacy of the disclosed method during actual converter operation, the test setup is configured as a buck converter. The large resistance is inserted by the auxiliary switches for a duration of 2 μs under the control of the microcontroller. After the measurement is completed, the system immediately returns to normal operation.

FIGS. 11A-11D display the experimental waveforms captured by a switching transients measurement board during continuous operation of the converter, with $V_{ds}$ maintained at 200V.

Aging Effect Compensation

The literature presents various temperature measurement methods based on TSEPs. However, TESP methods can be generally susceptible to aging effects. This implies that all TSEP-based methods require periodic calibration throughout their lifespan, posing challenges for practical applications. This paper employs the measurement of switching transient times during turn-on and turn-off events to estimate the junction temperature, incorporating aging compensation technique. Table II presents the relationship between $t'_r$ and $t'_f$ under various operating conditions. For SiC MOSFETs, it is observed that turn-on and turn-off switching transient times exhibit negative and positive temperature dependencies, respectively. Considering the positive aging dependency of these transient times, the measurement of device aging can be achieved as described below:

TABLE II

| The correlation between $t'_r$ and $t'_f$ with different operating conditions, | | |
|---|---|---|
| Operation Conditions | $t'_r$ | $t'_f$ |
| Temperature | Negative | Positive |
| Gate oxide degradation | Positive | Positive |
| Gate resistor | Positive | Positive |
| DC bus voltage | Negative | Positive |

$$\begin{cases} t'_r = -AT_j + BA_g + K_{on} \\ t'_f = CT_j + DA_g + K_{off} \end{cases} \qquad (13)$$

$$A_g = K_1 t'_r + K_2 t'_f + K_3 \qquad (14)$$

In practical applications, the gate resistance and DC bus voltage remain constant, and their impact can be incorporated into the one-time calibration process. Among the three primary failure mechanisms in SiC MOSFETs, namely package degradation, gate oxide degradation, and body diode degradation, it is worth noting that only gate oxide degradation has the potential to impact the parameters associated with switching transient times. A set of ten SiC MOSFETs with a blocking voltage of 1.2 KV and an on-resistance of 80 mΩ were subjected to an active channel gate bias (ACGB) test to induce aging.

A setup may be used for the ACGB test. In this test, the device under test (DUT) operates at a constant current while applying high gate bias at elevated temperatures. The selected channel current is adjusted to achieve a junction temperature of 150° C., and a positive gate bias is applied to generate an electric field across the gate oxide. The gate-source voltage for this test is set to 30V, and considering the gate oxide thickness of the tested SiC MOSFET (40 nm), the electric field across the gate oxide reaches 7 MV/cm. The gate leakage current is continuously monitored through the gate resistance using a differential amplifier. If the gate leakage current exceeds 1 mA, the test is halted.

FIGS. 12A-12C and 13A-13C illustrate the impact of aging on the turn-on and turn-off switching transients of the SiC MOSFET during the active channel gate bias test, respectively. The aging mechanisms have a noticeable impact on the gate plateau, delay times, and transient times, thereby emphasizing the importance of implementing aging compensation mechanisms.

Figure 14:
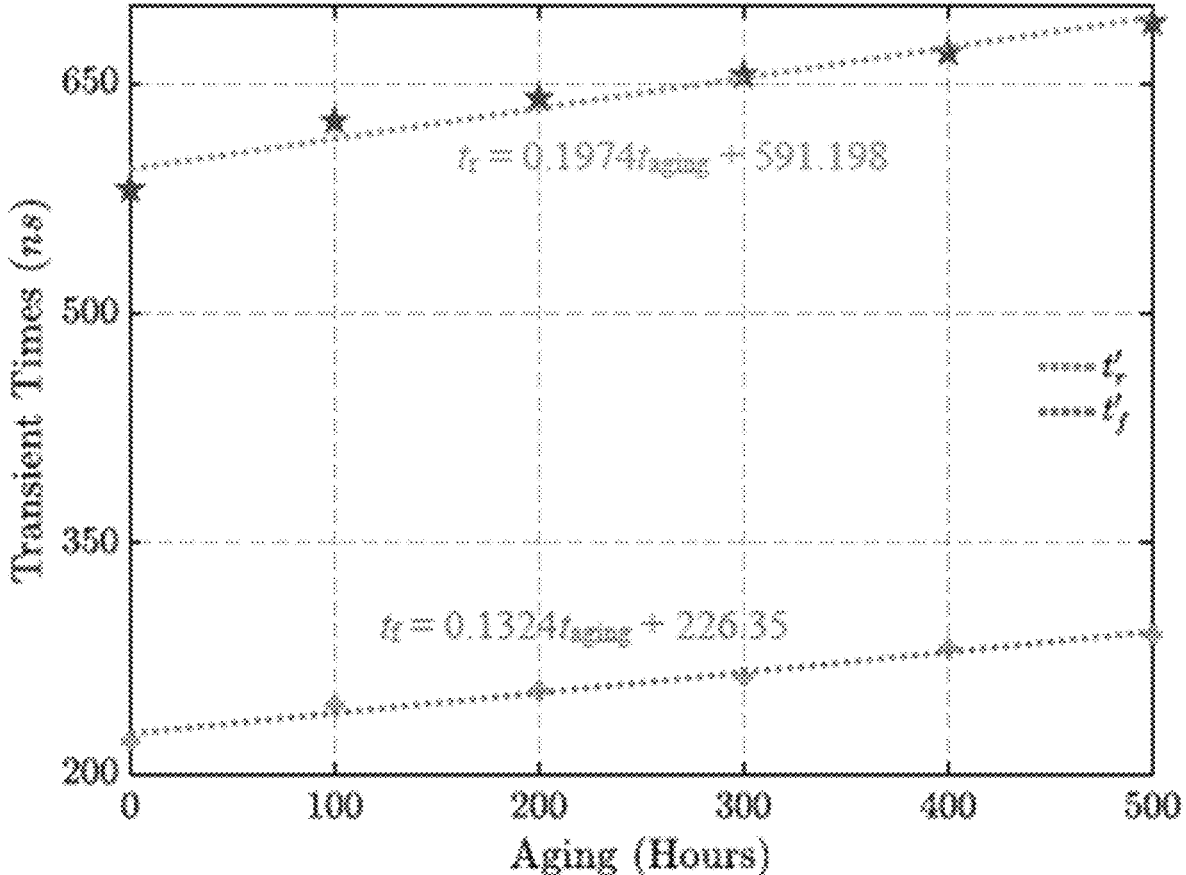
FIG. 14 reveals the relationship between transient times (t'r, t'f) and aging hours during the ACGB test, suggesting its utility for programming an aging compensation curve.

FIG. 14 presents the relationship between $t'_r$ and $t'_f$ and aging hours during the active channel gate bias test. The aging data can be used to program a fitted curve for the purpose of aging compensation.

The present disclosure introduces an innovative circuit design that provides a method for aging-compensated measurement of the junction temperature in Silicon Carbide (SiC) Metal-Oxide-Semiconductor Field-Effect Transistors (MOSFETs) through the utilization of switching transients. The disclosed circuit can utilize the voltage drop across the common source stray inductance to measure part of the switching transients at the rise and fall times. The disclosed circuit can capture the duration of the switching transients and can convert them into pulse widths. These pulse widths can be accurately measured, such as using a high-resolution capture module in a microcontroller. The experimental results validate the accuracy of the disclosed circuit, with a high correlation between the measured pulses and the junction temperature of the SiC MOSFET. This measurement technique offers a cost-effective solution that can be integrated into gate driver ICs. Also, the disclosed circuit addresses the limitations of existing temperature measurement methods based on thermal-sensitive electrical parameters by eliminating the need for frequent recalibration. The disclosed circuit can compensate for the aging dependencies of the rise and fall times at the switching transients. It is shown that the measurement of the rise time can be particularly suitable for temperature monitoring, and periodic measurement of the fall time can be used to recalibrate the temperature dependency lookup table.

In accordance with the present disclosure, the Silicon Carbide (SiC) Metal-Oxide-Semiconductor Field-Effect Transistor (MOSFET) is subjected to a decapsulation process, facilitating real-time monitoring through an Infrared (IR) imaging apparatus. Experimental data corroborate the high degree of accuracy and reliability of the circuit design as disclosed, exemplified by temperature measurement errors that are less than 1° C. The circuit design can be integrated into converter systems with little to no disruption, and its operation during the measurement phase does not impede the functional efficacy of the converter system. Through the adept capture and analysis of switching transients, the disclosed circuit design enables a method for efficacious thermal management and safeguarding of SiC MOSFETs.

Flow Diagram

Conventional techniques for managing switching transients and estimating device health parameters can suffer from limitations in temporal accuracy and real-time adaptability. The disclosed inventive concepts address these challenges by implementing a routine that can be managed by one or more computing device components. This routine enables precise control of gate resistance and gate-source voltage, thereby facilitating the capture and analysis of salient switching transient features. By capturing these features, the inventive concepts allow for the estimation of junction temperature and assessment of the remaining useful life of the MOSFET with improved accuracy and operational control. The application and utility of these inventive concepts are further elaborated through multiple operational blocks, coordinated control algorithms, and mathematical relationships that contribute to the efficacy of the system.

FIG. 15 is a flow diagram illustrative of an embodiment of a routine 1500, implemented by a computing device, for managing switching transients in a SiC MOSFET to estimate junction temperature and assess its remaining useful life. Although described as being implemented by the processor 430 of FIG. 4A, it will be understood that the elements outlined for routine 1500 can be implemented by one or more computing devices/components that are associated with the system 400 such as, but not limited to, the gate driver 440, the transistor 410, the measurement circuit 420, etc. Thus, the following illustrative embodiment should not be construed as limiting.

At block 1502, processor 430 communicates a first control signal to an auxiliary switch circuit 440, which can be electrically coupled to a gate path of transistor 410 (e.g., a SiC MOSFET. Upon receiving the first control signal, the auxiliary switch circuit 440 can be activated to introduce a selectable gate resistance into the gate path. This selectable gate resistance can be inserted for a defined temporal interval that can be less than a single switching cycle of the transistor 410. The temporal interval can allow for the enhanced capture of salient features of the switching transient without significantly affecting the overall switching performance of the transistor 410. In some cases, the insertion of the gate resistance modulates the switching transient, thereby enabling the measurement circuit 420 to capture the switching transient by aligning temporally with occurrence of the switching transient.

Consider a scenario where the DC bus voltage is maintained at a constant level (e.g., 200V), and the initial gate resistance is set at 552. In this setup, the processor 430 sends a first control signal that prompts the auxiliary switch circuit 440 to introduce an additional 1KΩ resistance into the gate path. This action can assist in capturing switching transients with $V_{sc}$ levels around 3V during turn-on and approximately 4V during turn-off.

At block 1504, the processor 430 communicates a second control signal to alter the gate-source voltage of the transistor 410. During this alteration of the gate-source voltage, a switching phase of the transistor 410 can be induced. This switching phase leads to the generation of a switching transient across a stray inductive element 402 situated along the source path of the transistor 410. The switching transient can be characterized by parameters such as rise time or fall time. In some cases, the processor 430 can be configured to coordinate with or control the auxiliary switch circuit 440 to ensure that the actions in blocks 1502 and 1504 occur concurrently. This coordination can be timed such that the pre-defined temporal interval aligns with the occurrence of the switching transient.

In the context of the described signal chain, the alteration in gate-source voltage can allow precise temporal control during the switching phase of the transistor 410. This can be relevant as the transient generated may serve as a measurable parameter for specific applications, such as temperature measurements. The control of the stray inductive element's transient response, via the processor's second control signal, can contribute to the accuracy or reliability of these measurements.

The aforementioned operations can take into account the circuit topology illustrated in FIGS. 4B, which comprises auxiliary switches (S1, S2), high input impedance buffer, and RC filter. The control algorithms and operational states of comparators, SR flip-flop logic circuits, and AND logic circuits further facilitate the measurement and analysis of the described switching transient.

At block 1506, the processor 430 obtains a first pulse signal. The first pulse signal can include a first pulse width that serves as a quantifiable metric, being proportionally related to a certain temporal characteristic of the switching transient. For example, the first pulse signal can have a first pulse width that is proportionally related to the rise time duration of the switching transient. The rise time duration can refer to the time it takes for the switching transient to go from a first threshold voltage (e.g., 10% of the maximum voltage) to a second threshold voltage (e.g., 90% of the maximum voltage).

At block 1508, the processor 430 obtains a second pulse signal. The second pulse signal can include a second pulse width that serves as a quantifiable metric, being proportionally related to a certain temporal characteristic of the switching transient. For example, the second pulse signal has a second pulse width that is proportionally related to the fall time duration of the switching transient. The rise time duration can refer to the time it takes for the switching transient to go from a third threshold voltage (e.g., 90% of the maximum voltage) to a fourth threshold voltage (e.g., 10% of the maximum voltage).

In block 1510, the processor 430 determines one or more estimates of a junction temperature of the MOSFET based on the first and second pulse widths. In some cases, the processor 430 determines a first estimate of the junction temperature based on the first pulse width and/or a second estimate of the junction temperature based on the second pulse width. In some cases, the processor 430 determines an estimate of the junction temperature based on the first and second pulse widths.

In some cases, the processor 430 can be configured to estimate the junction temperature of the MOSFET based on known relationships between the first and second pulse widths, denoted as $t_r'$ for the rise time and $t_f'$ for the fall time, and the temperature. These known relationships can be derived from mathematical models or algorithms that correlate the captured pulse widths with temperature values. Such relationships can be established empirically, through calibration procedures, or via theoretical analysis. By applying these known relationships, the processor 430 can effectively estimate the junction temperature of the MOSFET, thereby facilitating improved operational control and monitoring of the power switching system.

As an example, the processor 430 can determine an estimated junction temperature of the MOSFET by utilizing a mathematical model or algorithm that takes as input the first pulse width and/or the second pulse width. The mathematical model or algorithm can be derived through empirical data gathered under controlled conditions, wherein the MOSFET is subjected to varying temperature and the corresponding pulse widths are captured. Subsequently, a mathematical relationship can be established that maps these pulse widths to the actual measured temperature, creating a temperature estimation function, such as $T_{est1}=f(t_r')$; $T_{est2}=f(t_f')$, or $T_{est3}=f(t_r', t_f')$.

Consider an example in which the first pulse width $t_r'$ is captured as 2.5 ns and the second pulse width $t_f'$ is captured as 3.5 ns. Based on the temperature estimation function $T_{est}=0.5t_r'+0.3t_f'$, the estimated junction temperature can be calculated as $T_{est}=0.5 (2.5)+0.3(3.5)=2.3°$ C. This serves as an illustrative example of how the processor 430 can effectively utilize the first and second pulse widths to estimate the junction temperature of the MOSFET.

At block 1512, the processor 430 calculates the remaining useful life of the MOSFET based on the first and second estimates, as well as a useful life function. The useful life function correlates the remaining useful life with variables associated with the MOSFET's aging characteristics. The processor 430 can utilize the relationships detailed in equations (13) and (14) to quantify the aging variable $A_g$ based on the measured switching transient times $t_r'$ and $t_f'$.

Aging in this context can refer to the time-dependent degradation mechanisms that affect the MOSFET, including, but not limited to, gate oxide degradation. These degradation mechanisms can be quantified by shifts in switching transient times $t_r'$ and $t_f'$. Aging in the MOSFET can be detected and compensated for through real-time measurements and can be modeled as $A_g$ in equations (13) and (14).

The remaining useful life of the MOSFET can be dynamically updated, in real-time, by incorporating aging data, which is calculated based on the captured $t_r'$ and $t_f'$ under various operating conditions. The aging variable $A_g$ can act as an input to the useful life function. As the MOSFET ages, the parameters can be periodically or continuously updated, thereby providing a dynamically adjusted remaining useful life estimate.

In some cases, the processor 430 can evaluate the remaining useful life of the MOSFET as a percentage of its original operational life span, utilizing the calculated aging factor and high-resolution transient measurements. For instance, a remaining useful life evaluation of 20% can suggest that the MOSFET can be expected to reach a state where replacement or servicing can be beneficial, approximately within one-fifth of its original expected operational duration. Such an evaluation can allow for proactive measures to be taken, such as replacing or servicing the MOSFET, thereby mitigating the risk of device failure and contributing to the sustained efficacy of the electronic system in which the MOSFET can be found. The calculated percentage-based evaluation of the remaining useful life can serve as an enhanced indicator for maintenance planning and system reliability.

TERMINOLOGY

Computer programs typically comprise one or more instructions set at various times in various memory devices of a computing device, which, when read and executed by at least one processor, will cause a computing device to execute functions involving the disclosed techniques. In some embodiments, a carrier containing the aforementioned computer program product is provided. The carrier is one of an electronic signal, an optical signal, a radio signal, or a non-transitory computer-readable storage medium.

Any or all of the features and functions described above can be combined with each other, except to the extent it may be otherwise stated above or to the extent that any such embodiments may be incompatible by virtue of their function or structure, as will be apparent to persons of ordinary skill in the art. Unless contrary to physical possibility, it is envisioned that (i) the methods/steps described herein may be performed in any sequence and/or in any combination, and (ii) the components of respective embodiments may be combined in any manner.

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Unless the context clearly requires otherwise, throughout the description and the claims, the words "comprise," "comprising," and the like are to be construed in an inclusive sense, as opposed to an exclusive or exhaustive sense, e.g., in the sense of "including, but not limited to." As used herein, the terms "connected," "coupled," or any variant thereof means any connection or coupling, either direct or indirect, between two or more elements; the coupling or connection between the elements can be physical, logical, or a combination thereof. Additionally, the words "herein," "above," "below," and words of similar import, when used in this application, refer to this application as a whole and not to any particular portions of this application. Where the context permits, words using the singular or plural number may also include the plural or singular number, respectively. The word "or" in reference to a list of two or more items, covers all of the following interpretations of the word: any one of the items in the list, all of the items in the list, and any combination of the items in the list. Likewise the term "and/or" in reference to a list of two or more items, covers all of the following interpretations of the word: any one of the items in the list, all of the items in the list, and any combination of the items in the list.

Conjunctive language such as the phrase "at least one of X, Y and Z," unless specifically stated otherwise, is otherwise understood with the context as used in general to convey that an item, term, etc. may be either X, Y or Z, or any combination thereof. Thus, such conjunctive language is not generally intended to imply that certain embodiments require at least one of X, at least one of Y and at least one of Z to each be present. Further, use of the phrase "at least one of X, Y or Z" as used in general is to convey that an item, term, etc. may be either X, Y or Z, or any combination thereof.

In some embodiments, certain operations, acts, events, or functions of any of the algorithms described herein can be performed in a different sequence, can be added, merged, or left out altogether (e.g., not all are necessary for the practice of the algorithms). In certain embodiments, operations, acts, functions, or events can be performed concurrently, e.g., through multi-threaded processing, interrupt processing, or multiple processors or processor cores or on other parallel architectures, rather than sequentially.

Systems and modules described herein may comprise software, firmware, hardware, or any combination(s) of software, firmware, or hardware suitable for the purposes described. Software and other modules may reside and execute on servers, workstations, personal computers, computerized tablets, PDAs, and other computing devices suitable for the purposes described herein. Software and other modules may be accessible via local computer memory, via a network, via a browser, or via other means suitable for the purposes described herein. Data structures described herein may comprise computer files, variables, programming arrays, programming structures, or any electronic information storage schemes or methods, or any combinations thereof, suitable for the purposes described herein. User interface elements described herein may comprise elements from graphical user interfaces, interactive voice response, command line interfaces, and other suitable interfaces.

Processing of the various components of the illustrated systems can be distributed across multiple machines, networks, and other computing resources. Likewise, any data repositories shown or described can represent physical and/or logical data storage, including, e.g., storage area networks or other distributed storage systems. Moreover, in some embodiments the connections between the components shown represent possible paths of data flow, rather than actual connections between hardware. While some examples of possible connections are shown, any of the subset of the components shown can communicate with any other subset of components in various implementations.

Embodiments are also described above with reference to flow chart illustrations and/or block diagrams of methods, apparatus (systems) and computer program products. Each block of the flow chart illustrations and/or block diagrams, and combinations of blocks in the flow chart illustrations and/or block diagrams, may be implemented by computer program instructions. Such instructions may be provided to a processor of a general purpose computer, special purpose computer, specially-equipped computer (e.g., comprising a high-performance database server, a graphics subsystem, etc.) or other programmable data processing apparatus to produce a machine, such that the instructions, which execute via the processor(s) of the computer or other programmable data processing apparatus, create means for implementing the acts specified in the flow chart and/or block diagram block or blocks. These computer program instructions may also be stored in a non-transitory computer-readable memory that can direct a computer or other programmable data processing apparatus to operate in a particular manner, such that the instructions stored in the computer-readable memory produce an article of manufacture including instruction means which implement the acts specified in the flow chart and/or block diagram block or blocks. The computer program instructions may also be loaded to a computing device or other programmable data processing apparatus to cause operations to be performed on the computing device or other programmable apparatus to produce a computer implemented process such that the instructions which execute on the computing device or other programmable apparatus provide steps for implementing the acts specified in the flow chart and/or block diagram block or blocks.

Any patents and applications and other references noted above, including any that may be listed in accompanying filing papers, are incorporated herein by reference. Aspects of the invention can be modified, if necessary, to employ the systems, functions, and concepts of the various references described above to provide yet further implementations of the invention. These and other changes can be made to the invention in light of the above Detailed Description. While the above description describes certain examples of the invention, and describes the best mode contemplated, no matter how detailed the above appears in text, the invention can be practiced in many ways. Details of the system may vary considerably in its specific implementation, while still being encompassed by the invention disclosed herein. As noted above, particular terminology used when describing certain features or aspects of the invention should not be taken to imply that the terminology is being redefined herein to be restricted to any specific characteristics, features, or aspects of the invention with which that terminology is associated. In general, the terms used in the following claims should not be construed to limit the invention to the specific examples disclosed in the specification, unless the above Detailed Description section explicitly defines such terms. Accordingly, the actual scope of the invention encompasses not only the disclosed examples, but also all equivalent ways of practicing or implementing the invention under the claims.

The terminology used herein, such as "configured to," "adapted for," and "arranged to," serves to suggest that certain embodiments may incorporate particular circuit elements, configurations, or operational capabilities, while other embodiments may not. The inclusion of such terms does not imply that these elements, configurations, or capabilities are obligatory for any embodiment, nor does it indicate that specific logic exists for determining whether these elements, configurations, or operational capabilities are incorporated or executed in a given embodiment.

To reduce the number of claims, certain aspects of the invention are presented below in certain claim forms, but the applicant contemplates other aspects of the invention in any number of claim forms. Any claims intended to be treated under 35 U.S.C. § 112(f) will begin with the words "means for," but use of the term "for" in any other context is not intended to invoke treatment under 35 U.S.C. § 112(f). Accordingly, the applicant reserves the right to pursue additional claims after filing this application, in either this application or in a continuing application.

What is claimed is:

1. An apparatus comprising:
a measurement circuit electrically coupled to a source path of a metal-oxide-semiconductor field-effect transistor (MOSFET), the measurement circuit configured to:
capture a switching transient across a stray inductive element located at the source path of the MOSFET during a switching phase of the MOSFET, wherein the switching transient is characterized by a rise time or a fall time; and
transform the switching transient into a pulse characterized by a pulse width,
wherein the pulse width is proportional to a duration of the rise time or the fall time,
wherein a processor estimates a junction temperature of the MOSFET based on the pulse width and a predetermined relationship that associates specific rise times or fall times with corresponding junction temperatures.

2. The apparatus of claim 1, wherein the switching transient is characterized by the rise time and the fall time, wherein the pulse comprises a set of pulses including a first pulse and a second pulse, wherein the first pulse characterized by a first pulse width that is proportional to the duration of the rise time, wherein the second pulse is characterized by a second pulse width that is proportional to the duration of the fall time, and wherein the processor estimates a first estimate of the junction temperature of the MOSFET based on the rise time from the first pulse width and estimates a second estimate of the junction temperature of the MOSFET based on the fall time from the second pulse width.

3. The apparatus of claim 1, further comprising:
an auxiliary switch circuit electrically coupled to a gate path of the MOSFET, the auxiliary switch circuit configured to insert a gate resistance into the gate path for a defined temporal interval, wherein insertion of the gate resistance modulates the switching transient, thereby enabling the measurement circuit to capture the switching transient by aligning temporally with occurrence of the switching transient.

4. The apparatus of claim 3, wherein the insertion of the gate resistance is timed to coincide with the switching phase of the MOSFET.

5. The apparatus of claim 3, wherein the defined temporal interval is less than a single switching cycle of the MOSFET.

6. The apparatus of claim 3, wherein the defined temporal interval is approximately 2 microseconds.

7. The apparatus of claim 1, wherein the switching phase is an activation phase that corresponds to the MOSFET transitioning from an off-state to an on-state, and wherein the pulse width is proportional to the duration of the rise time.

8. The apparatus of claim 1, wherein the switching phase is a deactivation phase that corresponds to the MOSFET transitioning from an on-state to an off-state, and wherein the pulse width is proportional to the duration of the fall time.

9. The apparatus of claim 1, wherein to capture the switching transient, the measurement circuit detects a voltage drop across the stray inductive element located at a source terminal of the MOSFET.

10. The apparatus of claim 1, wherein the switching transients correspond to rapid changes in current and voltage that occur when the MOSFET turns on or off.

11. The apparatus of claim 1, further comprising a processor configured to analyze the pulse width to yield an estimate of the junction temperature of the MOSFET.

12. The apparatus of claim 1, wherein the stray inductive element comprises parasitic inductance originating from a geometric configuration or a spatial arrangement of circuit components, conductive traces, or interconnections in proximity to the MOSFET.

13. The apparatus of claim 1, wherein the measurement circuit comprises:
a high input impedance buffer electrically coupled to the source path, the high input impedance buffer configured to measure a voltage at a source terminal;
an RC filter circuit electrically coupled to the high input impedance buffer, the RC filter circuit configured to attenuate noise attributes resulting from power loop parasitic inductance;
a comparator circuit configured to invert and amplify a signal output the RC filter circuit, wherein reference values of comparators of the comparator circuit are selected to capture an initial ramp of the source voltage during the switching transient;
a flip-flop logic circuit electrically coupled to the comparator circuit, the flip-flop logic circuit configured to attenuate noise attributes by responding to an initial edge of the captured transient and resetting after completion of each individual measurement; and
an AND logic circuit electrically coupled to the flip-flop logic circuit, the AND logic circuit configured to generate the pulse.

14. The apparatus of claim 1, wherein the MOSFET is a silicon carbide SiC) MOSFET.

15. A measurement circuit configured to be electrically coupled to a source path of a metal-oxide-semiconductor field-effect transistor (MOSFET), the measurement circuit configured to:
capture a switching transient across a stray inductive element located at the source path of the MOSFET during a switching phase of the MOSFET, wherein the switching transient is characterized by a rise time and a fall time; and
transform the switching transient into a first pulse characterized by a first pulse width and a second pulse characterized by a second pulse width, wherein the first pulse width is proportional to a duration of the rise time, and wherein the second pulse width is proportional to a duration of the fall time, wherein a processor estimates a junction temperature of the MOSFET based on the first pulse width, the second pulse width, and a predetermined relationship that associates specific rise times or fall times with corresponding junction temperatures.

16. The measurement circuit of claim 15, wherein the MOSFET is a silicon carbide (SiC) MOSFET.

* * * * *